(12) United States Patent
Kubo et al.

(10) Patent No.: US 10,951,224 B2
(45) Date of Patent: Mar. 16, 2021

(54) SEMICONDUCTOR DEVICE

(71) Applicant: RENESAS ELECTRONICS CORPORATION, Tokyo (JP)

(72) Inventors: Terunori Kubo, Tokyo (JP); Narihira Takemura, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/839,892

(22) Filed: Apr. 3, 2020

(65) Prior Publication Data

US 2020/0382129 A1 Dec. 3, 2020

(30) Foreign Application Priority Data

May 31, 2019 (JP) .............................. JP2019-103266

(51) Int. Cl.
*H03M 1/00* (2006.01)
*H03M 1/46* (2006.01)
*H03M 1/12* (2006.01)

(52) U.S. Cl.
CPC ......... *H03M 1/462* (2013.01); *H03M 1/1245* (2013.01)

(58) Field of Classification Search
CPC ..... H03M 1/466; H03M 1/1245; H03M 1/265
USPC .......................... 341/122, 144, 155, 163, 141
See application file for complete search history.

(56) References Cited

U.S. PATENT DOCUMENTS

| 7,746,253 | B2 | 6/2010 | Kitagawa et al. |
| 9,960,777 | B2 * | 5/2018 | Duryea ............... H03M 1/1076 |
| 2006/0017603 | A1 * | 1/2006 | Demirdag .............. G11C 27/02 |
| | | | 341/172 |

FOREIGN PATENT DOCUMENTS

JP        2009-135738 A      6/2009

* cited by examiner

*Primary Examiner* — Peguy Jean Pierre
(74) *Attorney, Agent, or Firm* — McDermott Will & Emery LLP

(57) ABSTRACT

The semiconductor device according to this disclosure includes an analog input terminal, an amplifier circuit, a sample-and-hold circuit, an analog input switch connected between the analog input terminal and the input terminal of the amplifier circuit, a control switch connected between the output terminal of the amplifier circuit and the input terminal of the sample-and-hold circuit, a comparison circuit connected to the output terminal of the sample-and-hold circuit, an analog-to-digital converter connected to the comparator circuit, a control circuit, and a signal conversion circuit for converting the first control signal from the control circuit into a second control signal. The analog input switch is turned on during the activation level of the second control signal. The period of the activation level of the second control signal is longer than that of the first control signal to reduce a conversion error of an analog-to-digital conversion circuit.

16 Claims, 20 Drawing Sheets

FIG. 5
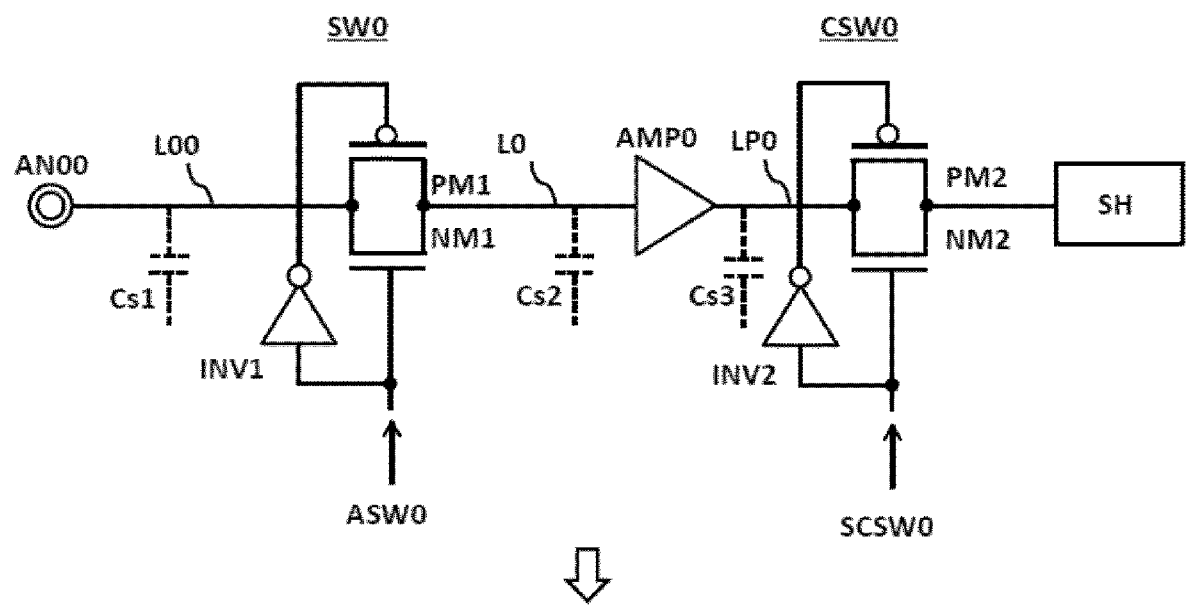
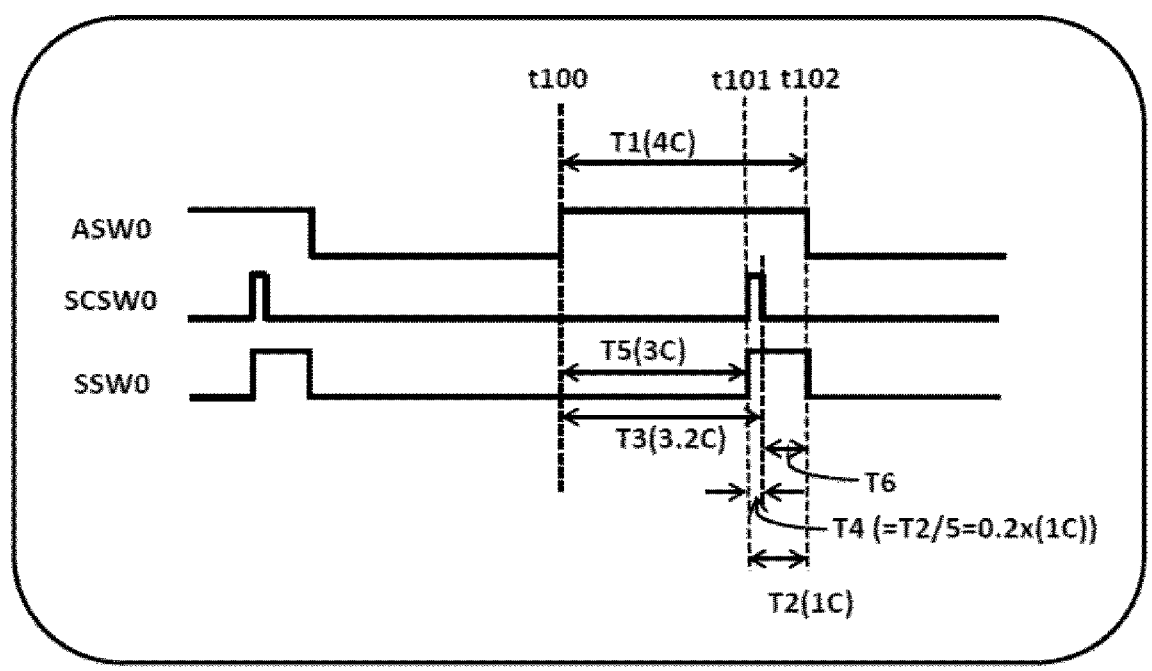

FIG. 6
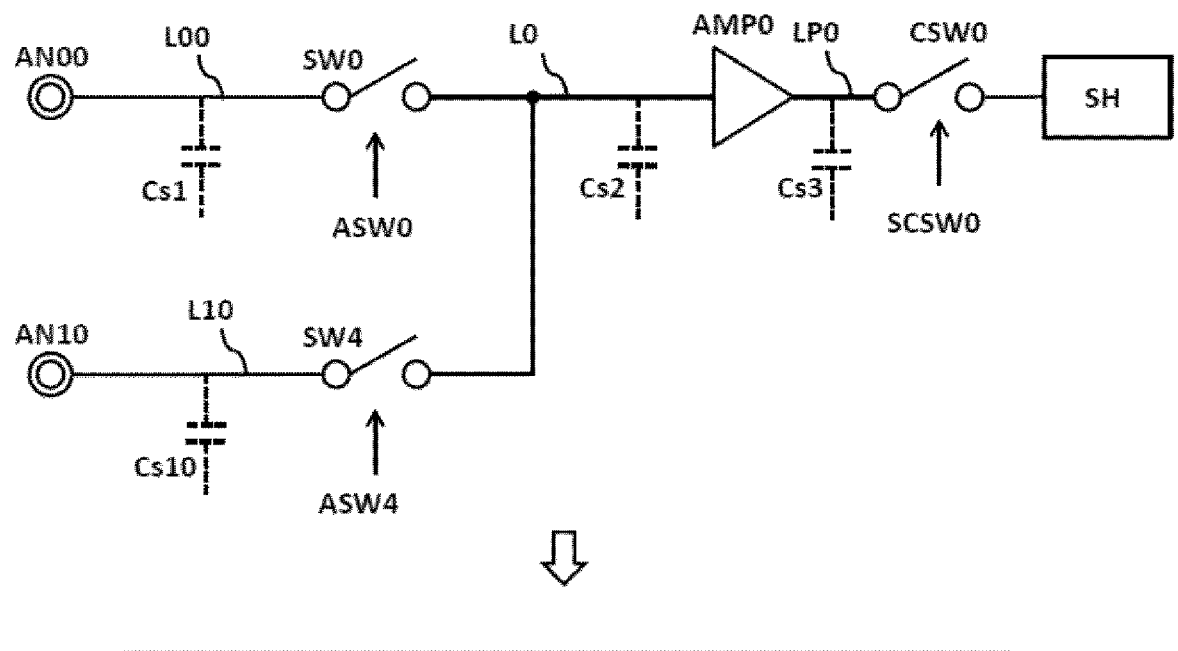
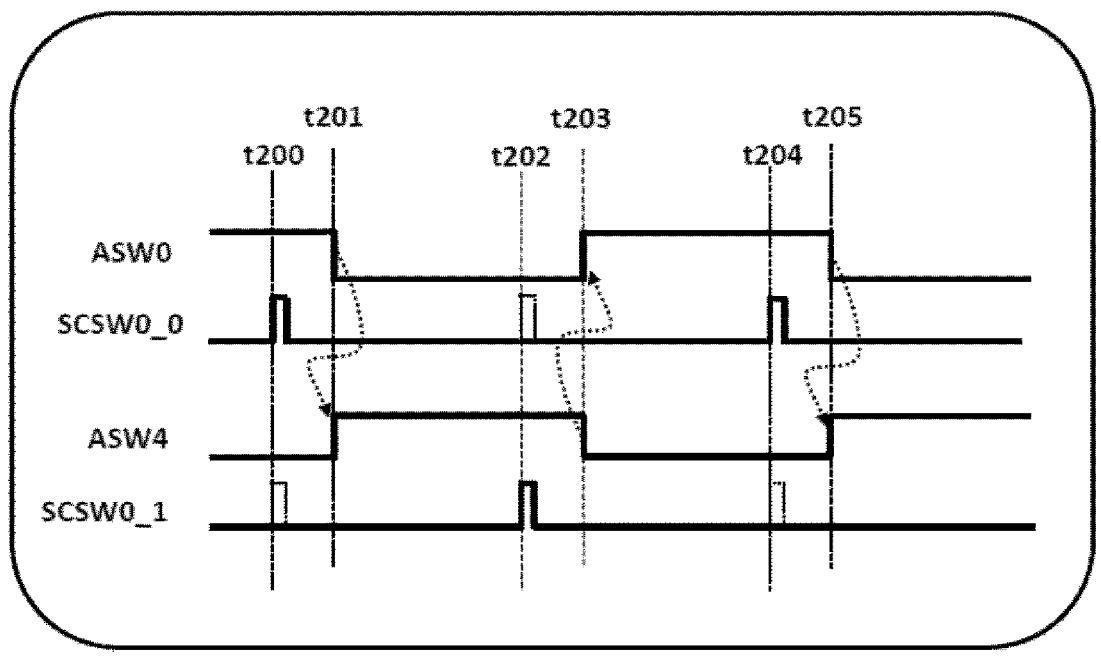

SEMICONDUCTOR DEVICE

CROSS-REFERENCE TO RELATED APPLICATIONS

The disclosure of Japanese Patent Application No. 2019-103266 filed on May 31, 2019 including the specification, drawings and abstract is incorporated herein by reference in its entirety.

BACKGROUND

The present disclosure relates to a semiconductor device, and more particularly, the present disclosure is applicable to a semiconductor device including analog-to-digital conversion circuits of a successive approximation type.

There are disclosed techniques listed below.
[Patent Document 1] Japanese Unexamined Patent Application Publication No. 2009-135738

In a successive approximation type analog-to-digital conversion circuit, a configuration has been proposed in which outputs of a plurality of amplifier circuits provided corresponding to a plurality of analog input terminals are selectively connected to the analog-to-digital conversion circuit (for example, see Japanese Unexamined Patent Application Publication No. 2009-135738).

SUMMARY

Each of a plurality of analog signals input to a plurality of analog input terminals may be sequentially converted into a digital signal by a scanning operation. In this case, each analog input terminal is connected to the analog-to-digital conversion circuit when the analog-to-digital conversion of the analog input signal to be converted is started, and the time for charging the parasitic capacitance existing in the path between the analog input terminal to be converted and the input of the amplifier circuit to the potential of the analog input signal to be converted is about the sampling time of the sample-and-hold circuit. The sampling time may be as short as 200 ns or 470 ns, for example.

For this reason, if the impedance of an external circuit such as a temperature sensor connected to the analog input terminal is not about several K$\omega$, the charging time of the parasitic capacitance does not elapse in the sampling period, and the conversion error may become large.

An object of the present disclosure is to provide a technique capable of reducing a conversion error of an analog-to-digital conversion circuit by making a charge time to a parasitic capacitance relatively long.

Other objects and novel features will become apparent from the description of this specification and the accompanying drawings.

An outline of representative ones of the present disclosure will be briefly described below.

An semiconductor device according to one embodiment includes an analog input terminal, an amplifier circuit having an input terminal and an output terminal, a sample-and-hold circuit having an input terminal and an output terminal, an analog input switch connected between the analog input terminal and the input terminal of the amplifier circuit, a control switch connected between the output terminal of the amplifier circuit and the input terminal of the sample-and-hold circuit, a comparator circuit connected to the output terminal of the sample-and-hold circuit, an analog-to-digital converter connected to the comparator circuit, a control circuit that outputs a first control signal, and a signal conversion circuit that converts the first control signal output from the control circuit into a second control signal. The control circuit further provides a third control signal to the control switch. The period of the activation level of the second control signal is longer than the period of the activation level of the first control signal. The third control signal is temporarily activated to turn on the control switch at the beginning of the period of the activation level of the first control signal. The analog input switch is turned on during the activation level of the second control signal.

According to the above-mentioned semiconductor device, the conversion error of the analog-to-digital converter can be reduced by relatively making the charging time to the parasitic capacitance long.

BRIEF DESCRIPTION OF THE DRAWINGS

FIG. 5 is a diagram illustrating a configuration between one analog input terminal and the sample-and-hold circuit of FIG. 4.

FIG. 6 is a diagram illustrating a configuration between two analog input terminals connected to one amplifier circuit of FIG. 4 and a sample-and-hold circuit.

DETAILED DESCRIPTION

Figure 1:
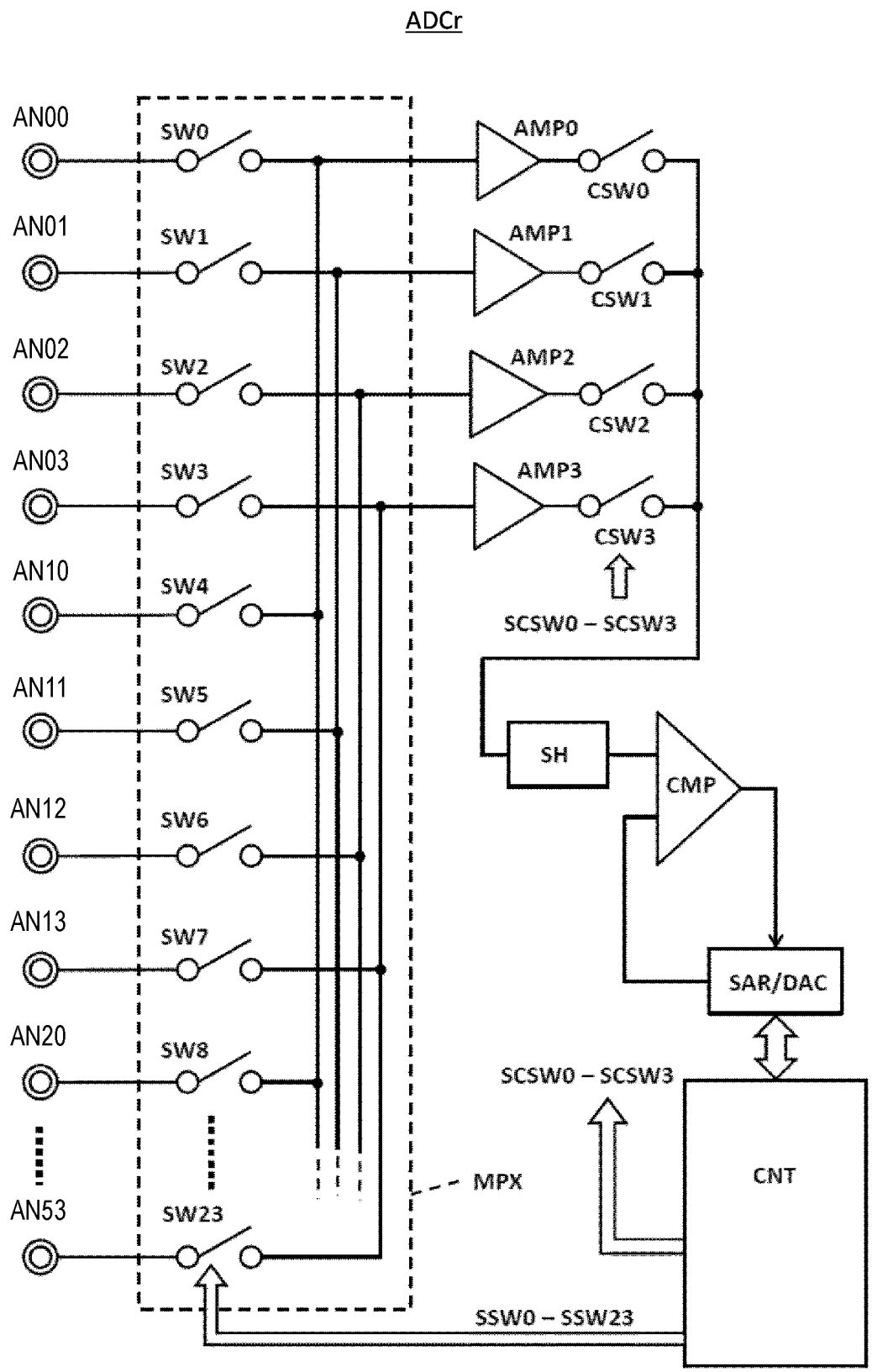
FIG. 1 is a diagram illustrating a configuration example of an analog-to-digital converter according to a comparative example.

Those embodiments and comparative examples will be described below with reference to the drawings. However, in the following description, the same components are denoted by the same reference numerals, and a repetitive description thereof may be omitted. It should be noted that the drawings may be represented schematically in comparison with actual embodiments for the sake of clarity of explanation, but are merely an example and do not limit the interpretation of the present invention.

Prior to the description of the embodiment, a configuration and an operation of a successive approximation type analog-to-digital conversion circuit which have been examined by the inventors will be described as a comparative example.

Figure 2:
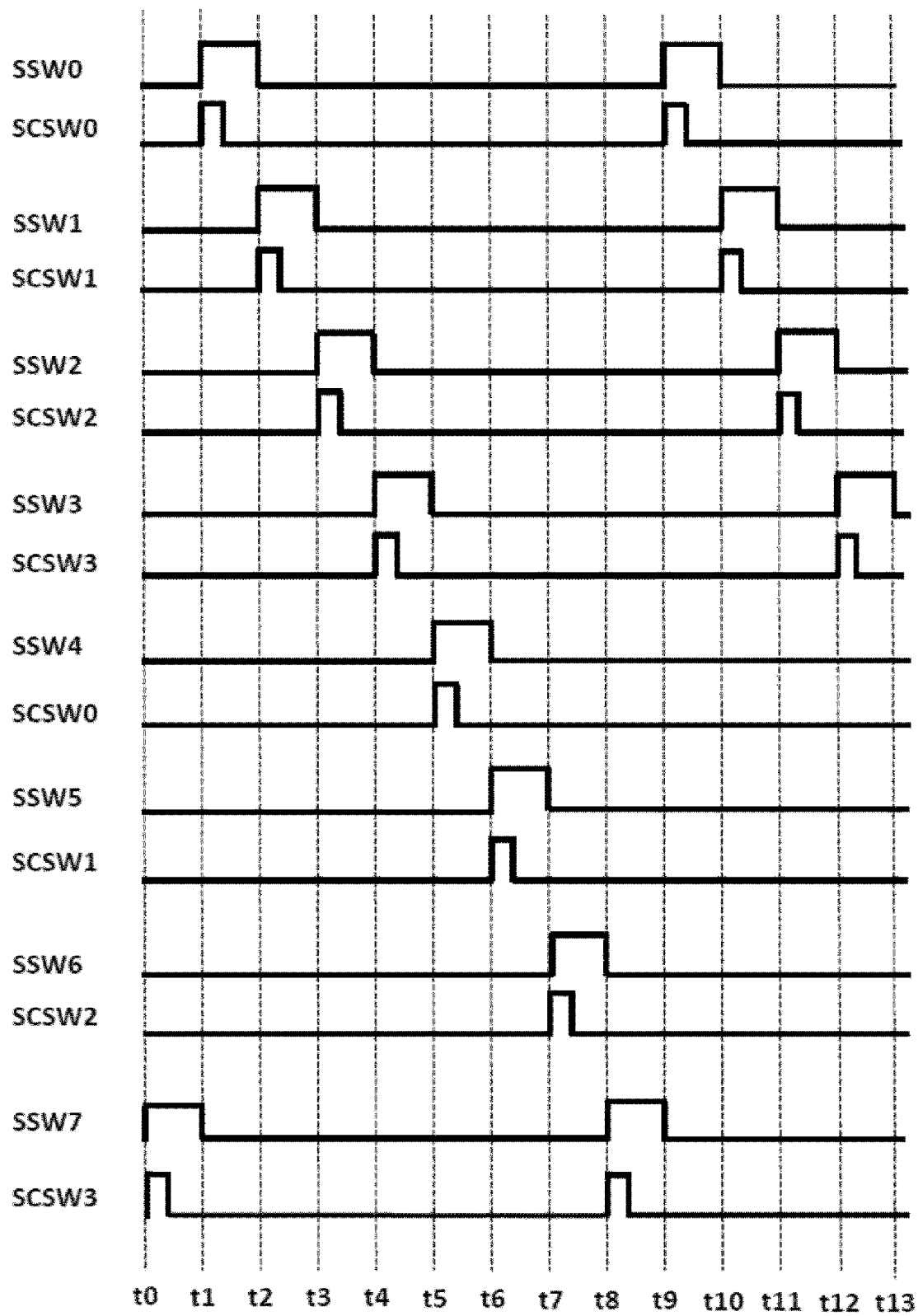
FIG. 2 is a diagram illustrating an example of operation waveforms of the analog-to-digital converter according to the comparative example.
Figure 3:
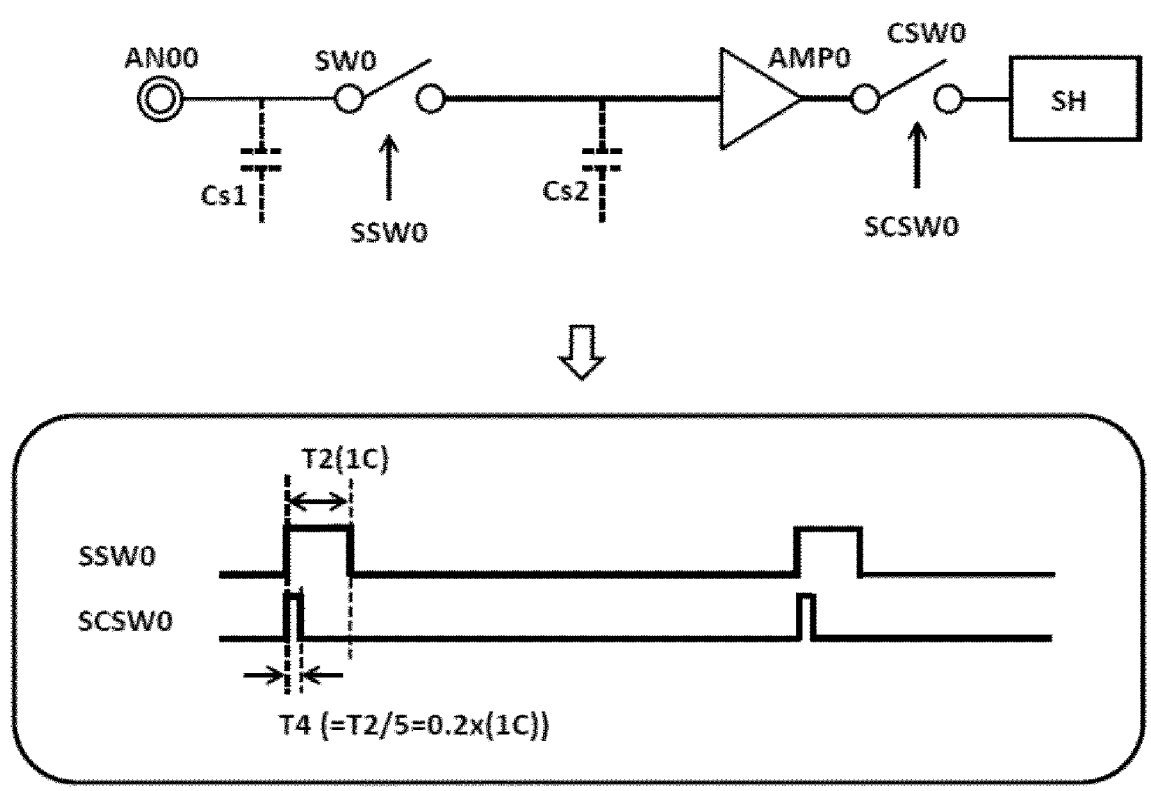
FIG. 3 is a diagram illustrating the problem.

FIG. 1 is a diagram illustrating a configuration example of an analog-to-digital converter according to a comparative example. FIG. 2 shows an example of operation waveforms of the analog-to-digital converter according to the comparative example. FIG. 3 is a diagram illustrating the problem. It should be noted that FIGS. 1-3 were discussed by the inventors and are not known in the art.

The successive approximation type analog-to-digital converter ADCr shown in FIG. 1 is incorporated in a semiconductor device formed using a manufacturing method of a known CMOS transistor in a single-crystal semiconductor substrate such as silicon. As shown in FIG. 1, the analog-to-digital conversion circuit ADCr includes a plurality of analog input terminals AN, multiplexers MPX, a plurality of amplifier circuits AMP (AMP0~AMP3), a plurality of control switches CSW (CSW0~CSW3), a sample-and-hold circuit SH, a comparator circuit CMP, an analog-to-digital converter SAR/DAC, and a control circuit CNT.

The plurality of analog input terminals AN is a plurality of external terminals provided in semiconductor device. In this embodiment, a plurality of analog input terminals AN is provided as in AN00~AN03, AN10~AN13, AN20~AN23, AN30~AN33, AN40~AN43, AN50~AN53. In FIG. 1, AN00~AN03, AN10~AN13, AN20, AN53 are shown as a representative example of the plurality of analog input terminals AN. The other plurality of analog input terminals AN21~AN23, AN30~AN33, AN40~AN43, AN50~AN52 are not shown.

The multiplexer MPX includes a plurality of analog input switches SW0~SW23. The plurality of analog input switches SW serve as analog input selection switches for selecting analog signals. The plurality of analog input switches SW include, in one instance, 24 analog input switches SW0~SW23. The on state and the off state of the analog input switches SW0~SW23 are controlled by the control signals SSW0~SSW23, respectively.

The analog input switch SW0 is connected between the analog input terminal AN00 and the input terminals of the amplifier circuits AMP0. When the analog input switch SW0 is turned on by the control signal SSW0, the analog input terminal AN00 and the input terminal of the amplifier circuit AMP0 are electrically connected to each other. The analog input switches SW1 are connected between the analog input terminal AN01 and the input terminal of the amplifier circuit AMP1. When the analog input switch SW1 is turned on by the control signal SSW1, the analog input terminal AN01 and the input terminal of the amplifier circuit AMP1 are electrically connected to each other. The analog input switch SW2 are connected between the analog input terminal AN02 and the input terminal of the amplifier circuit AMP2. When the analog input switch SW2 is turned on by the control signal SSW2, the analog input terminal AN02 and the input terminal of the amplifier circuit AMP2 are electrically connected to each other. The analog input switches SW3 are connected between the analog input terminal AN03 and the input terminal of the amplifier circuit AMP3. When the analog input switch SW3 is turned on by the control signal SSW3, the analog input terminal AN03 and the input terminal of the amplifier circuit AMP3 are electrically connected to each other.

The analog input switch SW4 is connected between the analog input terminal AN10 and the input terminal of the amplifier circuit AMP0. When the analog input switch SW4 is turned on by the control signal SSW4, the analog input terminal AN10 and the input terminal of the amplifier circuit AMP0 are electrically connected to each other. The analog input switch SW5 are connected between the analog input terminal AN11 and the input terminal of the amplifier circuit AMP1. When the analog input switch SW5 is turned on by the control signal SSW5, the analog input terminal AN11 and the input terminal of the amplifier circuit AMP1 are electrically connected to each other. The analog input switches SW6 are connected between the analog input terminal AN12 and the input terminal of the amplifier circuit AMP2. When the analog input switch SW6 is turned on by the control signal SSW6, the analog input terminal AN12 and the input terminal of the amplifier circuit AMP2 are electrically connected to each other. The analog input switches SW7 are connected between the analog input terminal AN13 and the input terminal of the amplifier circuit AMP3. When the analog input switch SW7 is turned on by the control signal SSW7, the analog input terminal AN13 and the input terminal of the amplifier circuit AMP3 are electrically connected to each other.

That is, the four analog input terminals are respectively connected to the input terminals of the four amplifier circuits AMP0~AMP3 via the four analog input switches such that one analog input terminal is connected to the input terminal of one amplifier circuit via one analog input switch.

Similarly, the analog input terminals AN20~AN23 are respectively connected to the input terminals of the amplifier circuits AMP0~AMP3 via analog input switches SW8~SW11. The analog input terminals AN30~AN33 are respectively connected to the input terminals of the amplifier circuits AMP0~AMP3 via analog input switches SW12~SW15. The analog input terminals AN40~AN43 are respectively connected to the input terminals of the amplifier circuits AMP0~AMP3 via analog input switches SW16~SW19. The analog input terminals AN50~AN53 are respectively connected to the input terminals of the amplifier circuits AMP0~AMP3 via analog input switches SW20~SW23.

Therefore, it has the following four paths. The first path is a path including six analog input terminals AN00, AN10, AN20, AN30, AN40, AN50 and an amplifier circuit AMP0, and the six analog input terminals AN00, AN10, AN20, AN30, AN40, AN50 are connectable to the input terminal of the amplifier circuit AMP0. The second path is a path including six analog input terminals AN01, AN11, AN21, AN31, AN41, AN51 and an amplifier circuit AMP1, and the six analog input terminals AN01, AN11, AN21, AN31, AN41, AN51 can be connectable to the input terminal of the amplifier circuit AMP1. The third path is a path including six analog input terminals AN02, AN12, AN22, AN32, AN42, AN52 and an amplifier circuit AMP2, and the six analog input terminals AN02, AN12, AN22, AN32, AN42, AN52 are connectable to the input terminal of the amplifier circuit AMP2. The fourth path is a path including six analog input terminals AN03, AN13, AN23, AN33, AN43, AN53 and an amplifier circuit AMP3, and the six analog input terminals AN03, AN13, AN23, AN33, AN43, AN53 are connectable to the input terminal of the amplifier circuit AMP3.

Each of the plurality of amplifier circuits AMP0~AMP3 buffers the analog signal supplied to its input terminal and outputs the analog signal to its output terminal.

Each of the plurality of control switches CSW0~CSW3 is connected between a corresponding output terminal of the plurality of amplifier circuits AMP0~AMP3 and an input terminal of the sample-and-hold circuit SH. The on state and the off state of the plurality of control switches CSW0~CSW3 are controlled by the control signals SCSW0~SCSW3. For example, when the control switch CSW0 is turned on by the control signal SCSW0, the output terminal of the amplifier circuit AMP0 is connected to the input terminal of the sample-and-hold circuit SH, and the voltage of the analog signal of the output terminal of the amplifier circuit AMP0 is sampled and held by the sample-and-hold circuit SH. The on state periods of the plurality of control switches CSW0~CSW3 do not overlap temporally. As a result, the output terminals of the plurality of amplifier circuits AMP0~AMP3 are selectively connected to the input terminal of the sample-and-hold circuit SH.

The comparator circuit CMP and the analog-to-digital converter SAR/DAC sequentially convert the voltage values of the analog signals held by the sample-and-hold circuit SH into digital signals. The analog-to-digital converter SAR/DAC includes a successive approximation circuit SAR and a digital-to-analog converter circuit DAC. For example, the comparison circuit CMP compares the voltage value of the analog signal input from the sample-and-hold circuit SH with the first reference potential supplied from the digital-to-analog conversion circuit DAC, and outputs the first comparison result. As a result of comparison, when the voltage value of the analog signal is lower than the first reference potential, "0" is output as a first comparison result, and when the voltage value of the analog signal is higher than the first reference potential, "1" is output as a first comparison result. When the first comparison result is "0", the digital-to-analog conversion circuit DAC generates a second reference potential lower than the first reference potential and supplies the second reference potential to the comparison circuit CMP. When the first comparison result is "1", the digital-to-analog conversion circuit DAC generates a second reference potential higher than the first reference potential, and supplies the second reference potential to the comparison circuit CMP. The comparison circuit CMP compares the voltage value of the analog signal with the second reference potential, and outputs the second comparison result. As a result of comparison, when the voltage value of the analog signal is lower than the second reference potential, "0" is output as the second comparison result, and when the voltage value of the analog signal is higher than the second reference potential, "1" is output as the second comparison result. When the second comparison result is "0", the digital-to-analog conversion circuit DAC generates a third reference potential lower than the second reference potential and supplies the third reference potential to the comparison circuit CMP. When the second comparison result is "1", the digital-to-analog conversion circuit DAC generates a third reference potential higher than the second reference potential, and supplies the third reference potential to the comparison circuit CMP. Then, the comparison circuit CMP performs the third comparison operation. The successive approximation logic SAR encodes the comparison result to generate a digital signal. The analog-to-digital converter SAR/DAC sequentially compares the voltage values of the analog signals with the respective reference potentials to generate, for example, a 10-bit digital signal.

The control circuit CNT includes a register for controlling the operation of the analog-to-digital conversion circuit ADCr, an A/D conversion result register for holding a conversion result, and the like. The content of the A/D conversion result register is supplied to, for example, a central processing unit (CPU) incorporated in semiconductor device. The control circuit CNT also generates a control signal SSW (SSW0~SSW23) for controlling the on state and the off state of the plurality of analog input switches SW (SW0~SW23), and a control signal SCSW (SCSW0~SCSW3 for controlling the on state and the off state of the control switch CSW (CSW0~CSW3).

FIG. 2 shows operation waveforms of the control signal SSW0~SSW7 and the control switch CSW0~CSW3 when the analog signal input to each of the eight analog input terminals AN00~AN03, AN10~AN13 is sequentially converted into a digital signal by the scanning operation.

At time t0, the control signal SSW7 transitions from a low level such as a non-selection level (or a non-activated level) to a high level such as a selection level (or an activated level), and the analog input switch SW7 is turned on. Further, the control signal SCSW3 transitions from a low level such as a non-selection level to a high level such as a selection level, and the control switch CSW3 is turned on. As a result, the analog signal supplied to the analog input terminal AN13 is sampled and held by the sample-and-hold circuit SH via the amplifier circuit AMP3. Thereafter, the control signal SCSW3 transitions from the high level to the low level, and the control switch CSW3 is turned off. Thereafter, the comparator circuit CMP and the analog-to-digital converter SAR/DAC convert the analog signal held by the sample-and-hold circuit SH into a digital signal.

At time t1, the control signal SSW7 transitions from the high level to the low level, the analog input switch SW7 is turned off, the control signal SSW0 transitions from the low level to the high level based on the transition of the control signal SSW7 from the high level to the low level, and the analog input switch SW0 is turned on. Further, the control signal SCSW0 transitions from the low level to the high level, and the control switch CSW0 is turned on. As a result, the analog signal supplied to the analog input terminal AN00 is sampled and held by the sample-and-hold circuit SH via the amplifier circuit AMP0. Thereafter, the control signal SCSW0 transitions from the high level to the low level, and the control switch CSW0 is turned off. Thereafter, the comparator circuit CMP and the analog-to-digital converter SAR/DAC convert the analog signal held by the sample-and-hold circuit SH into a digital signal.

At time t2, the control signal SSW0 transitions from the high level to the low level, the analog input switch SW0 is turned off, the control signal SSW1 transitions from the low level to the high level based on the transition of the control signal SSW0 from the high level to the low level, and the analog input switch SW1 is turned on. Further, the control signal SCSW1 transitions from the low level to the high level, and the control signal CSW1 is turned on. As a result, the analog signal supplied to the analog input terminal AN01 is sampled and held by the sample-and-hold circuit SH via the amplifier circuit AMP1. Thereafter, the control signal SCSW1 transitions from the high level to the low level, and the control switch CSW1 is turned off. Thereafter, the comparator circuit CMP and the analog-to-digital converter SAR/DAC convert the analog signal held by the sample-and-hold circuit SH into a digital signal.

Between time t3 and time t4, the analog input switch SW2 is turned on by the control signal SSW2, the control switch CSW2 is turned on by the control signal SCSW2, and the analog signal supplied to the analog input terminal AN02 is sampled by the sample-and-hold circuit SH using the amplifier circuit AMP2. As a result, the analog signal held in the sample-and-hold circuit SH is converted into a digital signal by the comparator circuit CMP and the analog-to-digital converter SAR/DAC.

Between time t4 and time t5, the analog input switch SW3 is turned on by the control signal SSW3, the control switch CSW3 is turned on by the control signal SCSW3, and the analog signal supplied to the analog input terminal AN03 is sampled by the sample-and-hold circuit SH using the amplifier circuit AMP3. As a result, the analog signal held in the sample-and-hold circuit SH is converted into a digital signal by the comparator circuit CMP and the analog-to-digital converter SAR/DAC.

Between time t5 and time t6, the analog input switch SW4 is turned on by the control signal SSW4, and the control input switch CSW0 is turned on by the control signal SCSW0. The analog signal supplied to the analog input terminal AN10 is sampled by the sample-and-hold circuit SH using the amplifier circuit AMP0. As a result, the analog signal held in the sample-and-hold circuit SH is converted into a digital signal by the comparator circuit CMP and the analog-to-digital converter SAR/DAC.

Between time t6 and time t7, the analog input switch SW5 is turned on by the control signal SSW5, and the control input switch CSW1 is turned on by the control signal SCSW1. The analog signal supplied to the analog input terminal AN11 is sampled by the sample-and-hold circuit SH via the amplifier circuit AMP1. As a result, the analog signal held in the sample-and-hold circuit SH is converted into a digital signal by the comparator circuit CMP and the analog-to-digital converter SAR/DAC.

Between time t7 and time t8, the analog input switch SW6 is turned on by the control signal SSW6, and the control input switch CSW2 is turned on by the control signal SCSW2. The analog signal supplied to the analog input terminal AN12 is sampled by the sample-and-hold circuit SH via the amplifier circuit AMP2. As a result, the analog signal held in the sample-and-hold circuit SH is converted into a digital signal by the comparator circuit CMP and the analog-to-digital converter SAR/DAC.

Between time t8 and time t9, the analog signal supplied to the analog input terminal AN13 is converted into a digital signal in the same manner as the operation between time t0 and time t1. Between time t9 and time t10, the analog signal supplied to the analog input terminal AN00 is converted into a digital signal in the same manner as the operation between time t1 and time t2. Between time t10 and time t11, the analog signal supplied to the analog input terminal AN01 is converted into a digital signal in the same manner as the operation between time t2 and time t3. Between time t11 and time t12, the analog signal supplied to the analog input terminal AN02 is converted into a digital signal in the same manner as the operation between time t3 and time t4. Between time t12 and time t13, the analog signal supplied to the analog input terminal AN03 is converted into a digital signal in the same manner as the operation between time t4 and time t5.

FIG. 3 is a diagram illustrating the problem. FIG. 3 representatively shows the structures of the analog input terminal AN00 and the sample-and-hold circuit SH.

A parasitic capacitance Cs1 exists in a wire between the analog input terminal AN00 and the analog input switch SW0. In addition, a parasitic capacitance Cs2 exists in a wire between the analog input switch SW0 and the input terminal of the amplifier AMP0.

The analog input terminal AN00 is coupled to the input terminal of the sample-and-hold circuit SH when the analog input switch SW0 is turned on by the high level of the control signal SSW0 and the control switch CSW0 is turned on by the high level of the control signal SCSW0. The transition of the control signal SCSW0 to the high level is substantially simultaneous with the transition of the control signal SSW0 to the high level. The transition of the control signal SSW0 to the high level instructs the start of the analog-to-digital conversion operation. In the high-level period T2 of the control signal SSW0, one analog-to-digital conversion operation is performed.

When the period T2 of the high level of the control signal SSW0 is one cycle (1C) of the analog-to-digital conversion operation, the period T4 of the high level of the control signal SCSW0 is provided at the beginning of the period T2 of the high level of the control signal SSW0, and is about ⅕ of the period T2 (T2/5=0.2×(1C)). The period T4 can be regarded as the sampling time of the potential of the analog signal in the sample-and-hold circuit SH. The period T2 is 1 μS (second) in one example, and the period T4 is 200 nS (seconds) in the one example. The period T4 is not limited to 200 nS and is merely an example. The period T4 may take various values depending on the configuration of the analog-to-digital conversion circuit. For example, the period T4 may be a value such as 470 nS. In the following description, as a representative example, the period T4 is mainly described as an example of 200 nS.

During this time T4, the parasitic capacitance Cs1, Cs2 needs to be charged to the potential of the analog signals supplied to the analog input terminal AN00. For this reason, if the impedance of an external circuit such as a sensor connected to the analog input terminal AN00 is not about several KS) (ohms), the parasitic capacitance Cs1,Cs2 may not be charged in time during the sampling period T4, and the conversion error in the analog-to-digital conversion may become large.

In order to perform faster analog-to-digital conversion while keeping the conversion error small, for example, the following method can be considered. 1) The gate width of the MOS switch transistor constituting the analog input switch SW0~SW23 is increased. 2) The capacitance of the sampling capacitor in the sample-and-hold circuit SH is reduced. 3) In order to reduce the impedances of external circuits that drive the analog inputs from the outside, a capacitor several thousand times larger than the sampling capacitance is added to the outside of semiconductor device. 4) An operational amplifier is connected to the outside of semiconductor device as a buffer amplifier for driving the analog input terminal from the outside.

However, there is a limit to increase the size of the switch transistor. If the capacitance of the sampling capacitor is reduced, the conversion error becomes large. The addition of an external capacitor requires a longer period for analog-to-digital conversion of the corresponding analog input terminal. The addition of a buffer amplifier increases the size and costs of the circuit board on which semiconductor device is mounted.

In particular, in the case of analog-to-digital conversion of an analog signal from a temperature sensor having a high impedance, it is sometimes necessary to take measures such as reducing the speed of analog-to-digital conversion. If the number of analog input terminals is small, an analog buffer amplifier may be incorporated in each analog input terminal. However, when the number of analog input terminals is large, the area of semiconductor substrate increases, which increases the cost of semiconductor device.

(An embodiment) In the successive approximation type analog-to-digital conversion circuit ADC, the ADC has four systems of a wiring path (first path to fourth path) and an amplifier circuit AMP (AMP0~AMP3) for performing analog-to-digital conversion. The standby state is maintained until the analog-to-digital conversion of the corresponding analog input signal is started. Signal conversion circuits (SWCNV) for prefetching the control signal SSW (SSW0~SSW23) of the analog input switch SW (SW0~SW23) in the standby state are added so that the analog input signal of the analog input terminal to be subjected to the analog-to-digital conversion can be fetched next. The signal conversion circuit (SWCNV) widens the width of the high level (activation level) of the control signal SSW (SSW0~SSW23), generates a widened control signal ASW (ASW0~ASW23), and supplies the widened control signal ASW (ASW0~ASW23) to the analog input switch SW (SW0~SW23). Therefore, the on state of the analog input switch SW (SW0~SW23) is temporally advanced. The plurality of control signals SSW0~SSW23 may be referred to as a first control signal. The plurality of control signals ASW0~ASW23 may be referred to as a second control signal.

The amplifier circuits AMP0~AMP3 are configured to be constantly energized. As a result, when the plurality of control signals SCSW (SCSW0~SCSW3) of the control switch CSW (CSW0~CSW3) is switched from the low level to the high level, the output of the corresponding amplifier circuit AMP (AMP0~AMP3) is sufficiently stabilized, and the potential of the subsequent analog input signal is transmitted to the sample-and-hold circuit SH. The control signal SCSW(SCSW0~SCSW3) may be referred to as a third control signal.

According to an embodiment, the control signal ASW (ASW0~ASW23) is generated by the signal conversion circuit (SWCNV) so that the stabilization period until the parasitic capacitance (Cs1,Cs2) of the input wire portion of the amplifier circuit AMP (AMP0~AMP3) is charged with the voltage of the analog input signal is secured in advance. As a result, the charge time of the parasitic capacitance (Cs1,Cs2) is changed from about ⅕ (0.2 cycle) of the time for converting one analog input signal (T2=1 cycle) to about ⅕ plus the conversion time of the other three analog input terminals (3.2 cycle). Therefore, since the charge time of the parasitic capacitance (Cs1,Cs2) can be 16 times, the analog-to-digital converter can be performed at high speed and effects such as simplification of external circuits of the analog input terminals and reduction in cost can be obtained, while avoiding a large increase in cost.

Hereinafter, an embodiment will be described with reference to the drawings. In the embodiment, as in the comparative example, a configuration example of a successive approximation type analog-to-digital conversion circuit ADC in the case where a plurality of analog input signals supplied to a plurality of analog input terminals AN is analog-to-digital converted by a scanning operation using four amplifier circuits AMP0~AMP3 (or first to fourth paths) will be described. The plurality of analog inputs AN is AN00~AN03, AN10~AN13, AN20~AN23, AN30~AN33, AN40~AN43, AN50~AN53.

Figure 4:
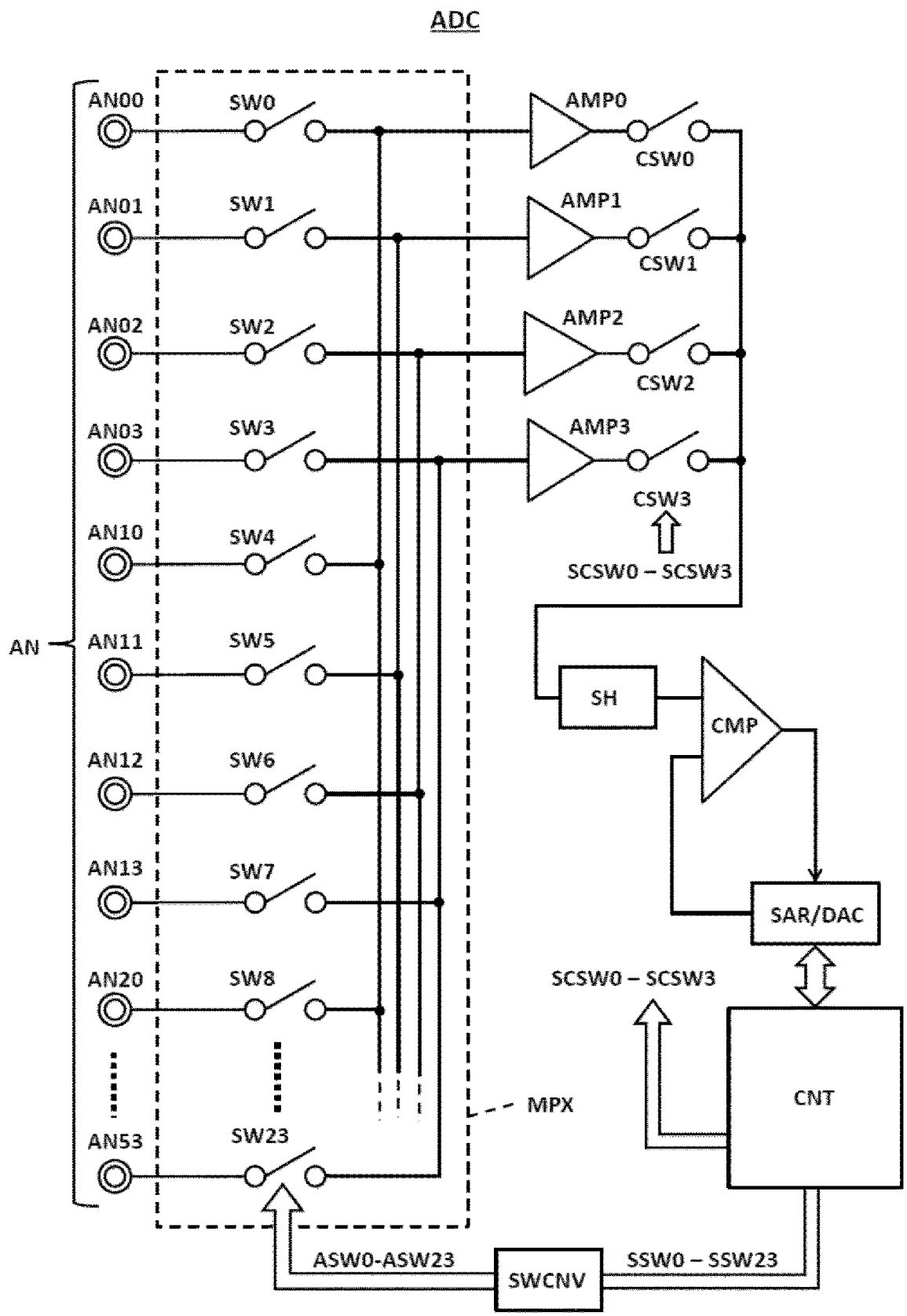
FIG. 4 is a diagram illustrating a configuration example of an analog-to-digital converter according to an embodiment of this disclosure.
Figure 7:
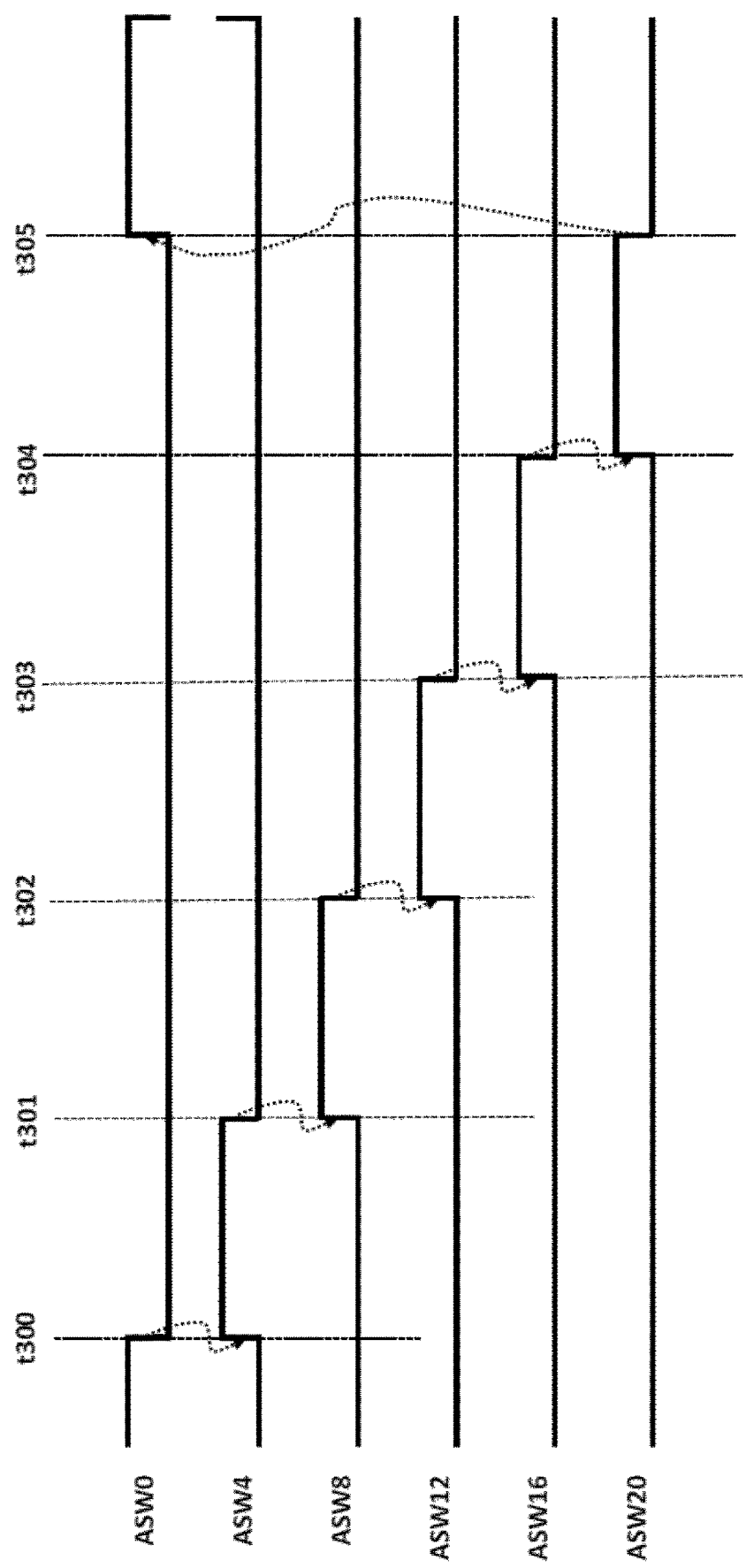
FIG. 7 is a diagram illustrating operation waveforms of six control signals in a scanning operation of six analog input terminals connected to one amplifier circuit of FIG. 4.
Figure 8:
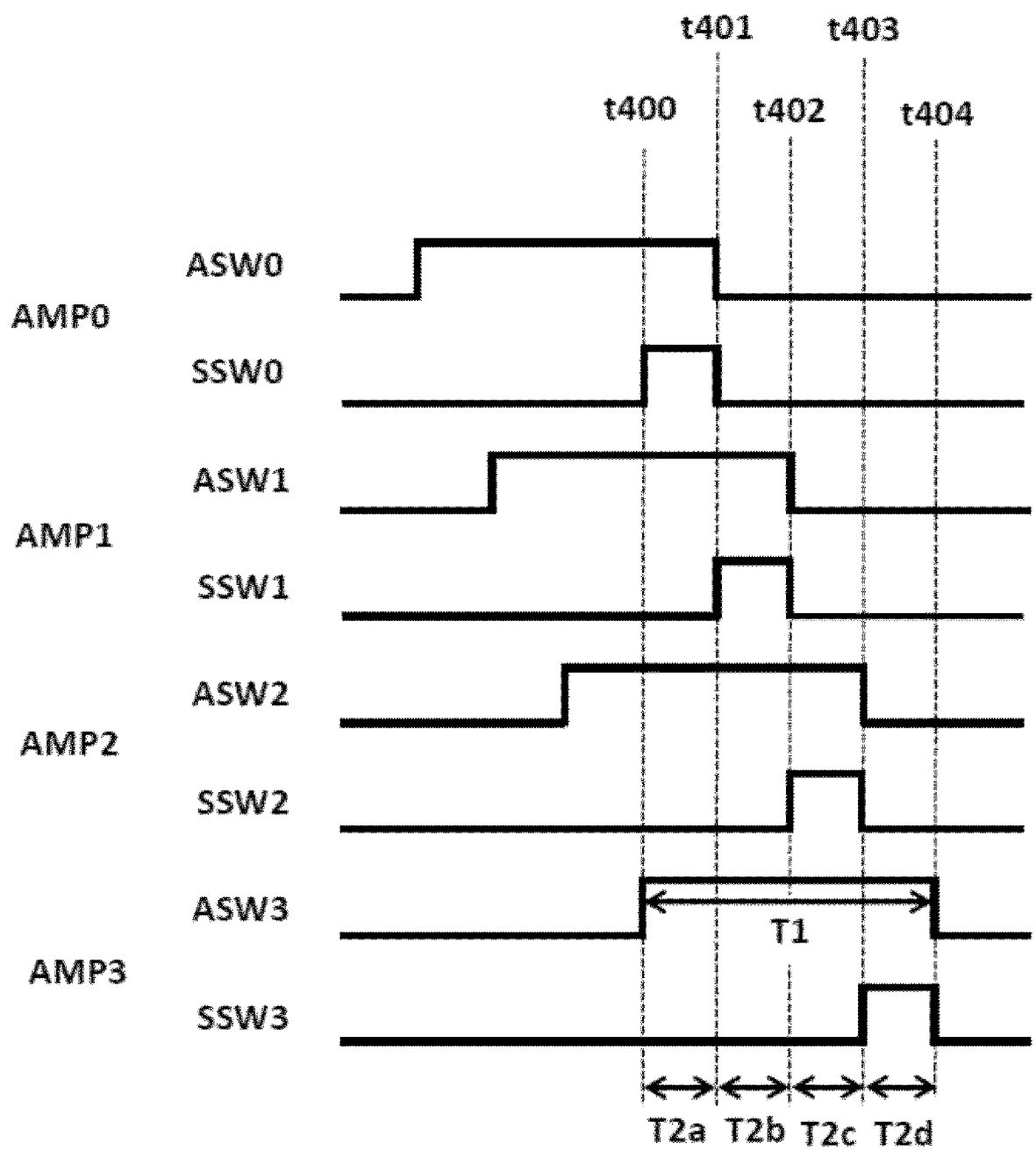
FIG. 8 is a diagram illustrating a method of generating a high-level period of the control signal.
Figure 9:
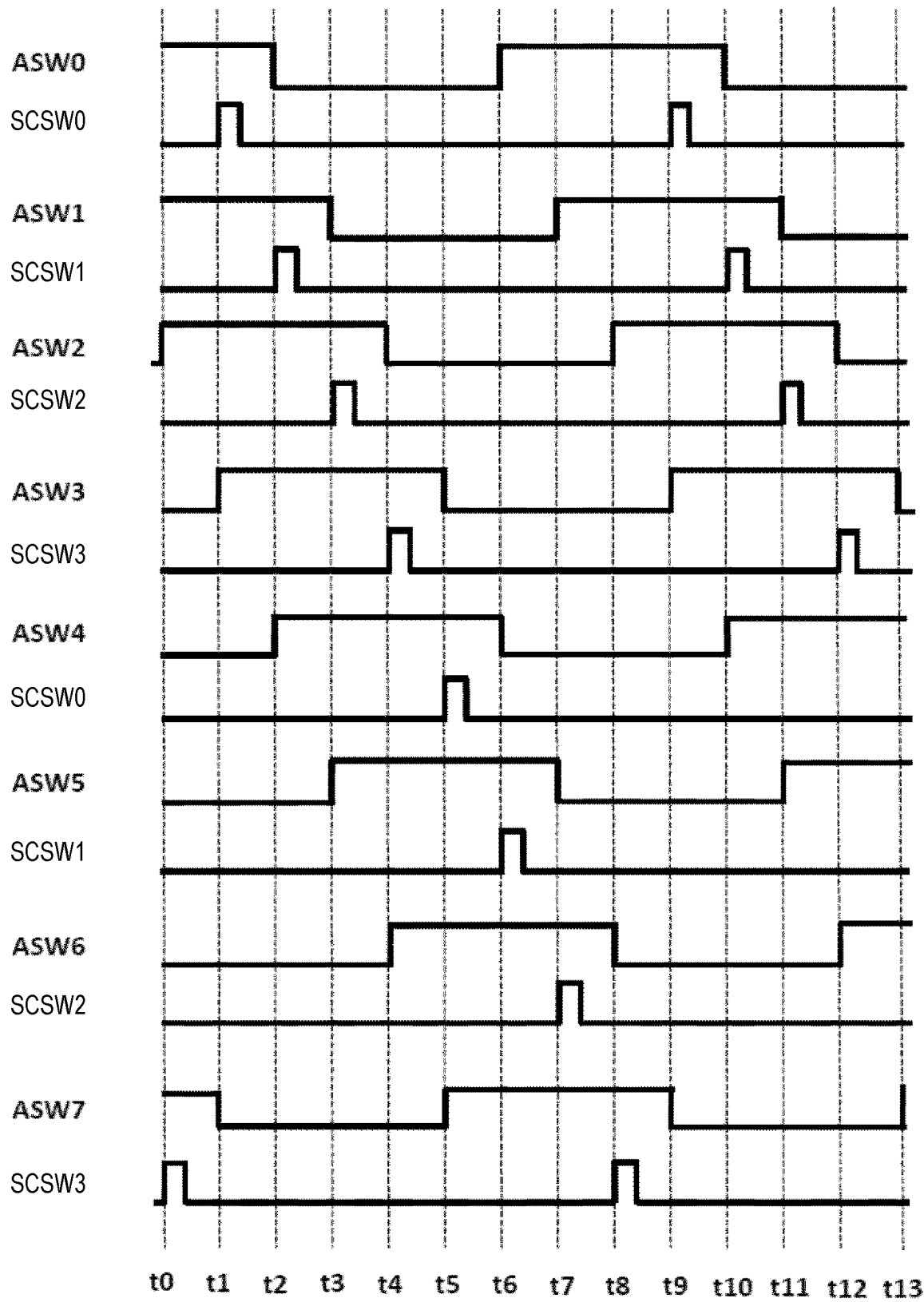
FIG. 9 illustrates exemplary operation waveforms of an analog-to-digital converter according to an embodiment.

FIG. 4 is a diagram illustrating a configuration example of an analog-to-digital converter ADC according to the embodiment. FIG. 5 is a diagram illustrating a configuration between one of the analog input terminals AN00 and the sample-and-hold circuits SH of FIG. 4. FIG. 6 is a diagram illustrating a configuration between two analog input terminals AN00, AN10 connected to one amplifier circuit AMP0 of FIG. 4 and a sample-and-hold circuit SH. FIG. 7 is a diagram illustrating operation waveforms of the six control signals ASW0, ASW4, ASW8, ASW12, ASW16, ASW20 in the scanning operation of the six analog input terminals AN00, AN10, AN20, AN30, AN40, AN50 connected to one amplifier circuit AMP0 of FIG. 4. FIG. 8 is a diagram illustrating a method of generating the high-level period T1 of the control signal ASW. FIG. 9 illustrates exemplary operation waveforms the analog-to-digital converter ADC according to the embodiment.

The analog-to-digital conversion circuit ADC shown in FIG. 4 differs from the analog-to-digital conversion circuit ADCr shown in FIG. 1 in that a signal conversion circuit SWCNV is provided in the analog-to-digital conversion circuit ADC shown in FIG. 4, and in that a plurality of amplifier circuits AMP (AMP0~AMP3) is configured to maintain an energized state at all times in a state in which the analog-to-digital conversion of the analog-to-digital conversion circuit ADC is instructed. The signal conversion circuit SWCNV receives a plurality of control signals SSW (SSW0~SSW23) and generates a plurality of control signals ASW (ASW0~ASW23). The plurality of control signals SSW0~SSW23 may be referred to as the first control signal. The plurality of control signals ASW0~ASW23 may be referred to as the second control signal.

The plurality of control signals ASW (ASW0~ASW23) are supplied to the gates of the plurality of analog input switches SW (SW0~SW23) respectively. The period of the high level (activation level) of each of the plurality of control signals ASW (ASW0~ASW23), i.e., T1, is longer than the period of the high level (activation level) of each of the plurality of control signals SSW (SSW0~SSW23), i.e., T2. Therefore, the on state period T1 of each of the plurality of analog input switches SW (SW0~SW23) to which the plurality of control signals ASW (ASW0~ASW23) are supplied is longer than the on state period T2 of each of the analog input switches SW0~SW23 to which the control signals SSW0~SSW23 of FIG. 1 are supplied. Other configurations and operations of the analog-to-digital conversion circuit ADC shown in FIG. 4 are the same as those of the analog-to-digital conversion circuit ADCr shown in FIG. 1, and therefore detailed descriptions thereof are omitted.

As a representative example, FIG. 5 shows a configuration example between the analog input terminal AN00 and the sample-and-hold circuit SH. As shown in FIG. 5, an analog input switch SW0, an amplifier circuit AMP0, and a control switch CSW0 are connected between the analog input terminal AN00 and the input terminal of the sample-and-hold circuit SH.

The analog input switch SW0 includes an N-channel MOS field effect transistor (hereinafter referred to as a transistor) NM1, a P-channel MOS field effect transistor (hereinafter referred to as a transistor) PM1, and an inverter circuit INV1. The transistor NM1 has a source-drain path connected between the analog input terminal AN00 and the input terminal of the amplifier AMP0, and a gate for receiving the control signal ASW0. The transistor PM1 has a source-drain path connected between the analog input terminal AN00 and the input terminal of the amplifier circuit AMP0, and a gate connected to the output terminal of the inverter circuit INV1. Inverter circuit INV1 receives control signal ASW0 at its input terminal and outputs an inverted signal of control signal ASW0 from its output terminal. That is, the source-drain path of the transistor NM1 and the source-drain path of the transistor PM1 are connected in parallel between the analog input terminal AN00 and the input terminal of the amplifier circuit AMP0, and the transistor NM1, PM1 constitutes a CMOS switch. The transistor NM1,PM1 is controlled to be turned on by the high level of the control signal ASW0. The analog input switch SW1~SW23 can also adopt the same CMOS switch configuration as described above.

In one embodiment, the control switch CSW0 includes an N-channel MOS field effect transistor (hereinafter referred to as a transistor) NM2, a P-channel MOS field effect transistor (hereinafter referred to as a transistor) PM2, and an inverter circuit INV2. The transistor NM2 has a source-drain path connected between the output terminal of the amplifier circuit AMP0 and the input terminal of the sample-and-hold circuit SH, and a gate for receiving the control signal SCSW0. The transistor PM2 has a source-drain path connected between the output terminal of the amplifier circuit AMP0 and the input terminal of the sample-and-hold circuit SH, and a gate connected to the output terminal of the inverter circuit INV2. Inverter circuit INV2 receives control signal SCSW0 at its input terminal and outputs an inverted signal of control signal SCSW0 from its output terminal. That is, the source-drain path of the transistor NM2 and the source-drain path of the transistor PM2 are connected in parallel between the output terminal of the amplifier circuit AMP0 and the input terminal of the sample-and-hold circuit SH, and the transistor NM2, PM2 constitutes a CMOS switch. The transistor NM2, PM2 is controlled to be turned on by the high level of the control signal SCSW0. The control switch CSW1~CSW3 can also adopt the same configuration of CMOS switch as described above. The control signal SCSW0~SCSW3 may be referred to as a third control signal.

As shown in FIG. 5, the metal wiring L0 provided between the analog input terminal AN00 and the analog input switch SW0 has a parasitic capacitance Cs1, and the metal wiring L0 provided between the analog input switch SW0 and the input terminal of the amplifier AMP0 has a parasitic capacitance Cs2. A parasitic capacitance Cs3 is present in the metallization line LP0 provided between the output terminal of the amplifier circuit AMP0 and the input terminal of the sample-and-hold circuit SH.

The high-level period T1 of the control signal ASW0 generated by the signal conversion circuit SWCNV is set to four cycles (4C) when the high-level period T2 of the control signal SSW0 is set to one cycle (1C) of the analog-to-digital conversion operation, as shown in FIG. 5. That is, the time t100 at which the control signal ASW0 transitions from the low level (inactivation level) to the high level (activation level) is earlier than the time t101 at which the control signal SSW0 transitions from the low level to the high level, by the period T5. The period T5 is a period corresponding to three cycles 3C. On the other hand, both the control signal ASW0 and the control signal SSW0 transition from the high level to the low level at the time t102. Similar to FIG. 3, the transition of the control signal SCSW0 from the low level to the high level is substantially simultaneous with the transition of the control signal SSW0 from the low level to the high level (time t101). The high-level period T4 of the control signal SCSW0 is provided at the beginning of the high-level period T2 of the control signal SSW0, and is about ⅕ of the period T2, i.e., T2/5=0.2×(1C). The period T2 includes a period T4 and a period T6. The period T4 can be regarded as the sampling time of the potential of the analog signal in the sample-and-hold circuit SH. The period T2 is 1 pS (sec) in one example, and the period T4 is 200 nS (sec) in one example. The period T6 can be regarded as the conversion time of the analog-to-digital conversion of the potential of the analog signal sampled by the sample-and-hold circuit SH.

The period T1 can also be defined as follows. The period T1 includes an extended charging period of the parasitic capacitance indicated by the period T5, a sampling period indicated by the period T4, and an analog-to-digital conversion period indicated by the period T6.

Therefore, in this embodiment, since the amplifier circuit AMP0 is constantly kept in the energized state in a state in which the analog-to-digital conversion of the analog-to-digital conversion circuit ADC is instructed, the parasitic capacitance Cs1, Cs2, Cs3 is charged in advance to the potential of the analog input signal input to the analog input terminal AN00 in the period T5 (3C) between the time t100 and the time t101. Also, in the period T4, the parasitic capacitance Cs1, Cs2, Cs3 is charged to the potential of the analog input signal input to the analog input terminal AN00. That is, the sum of the charge times of the parasitic capacitance Cs1, Cs2, Cs3 becomes T5+T4=T3 (3.2C), and a charge time 16 times longer than the charge time T4 (0.2C) of the parasitic capacitance Cs1,Cs2 described in FIG. 3 is secured. When the period T4 is 472 nS (sec), a long charging time of about 7.4 times is ensured.

As a result, the sample-and-hold circuit SH can sample and hold the stable potential of the analog input signal. Therefore, the analog-to-digital conversion can be performed at high speed while avoiding a large increase in cost, and effects such as simplification of the external circuit of the analog-to-digital input terminal and cost reduction can be obtained.

The reason why the period T1 is 4C is that the scanning operation employs a configuration in which the four amplifier circuits AMP0~AMP3 are sequentially connected to the sample-and-hold circuits SH by the control switches CSW0~CSW3. When the number of amplifier circuits (or the number of paths) used for the scanning operation is three, the period T1 is 3C. When the number of amplifier circuits (or the number of paths) used for the scanning operation is two, the period T1 is 2C. When the analog-to-digital converter ADC includes five amplifier circuits AMP and five control switches CSW and the five amplifier circuits are used for scanning, the period T1 is 5C.

FIG. 6 shows, as a representative example, a configuration example between the analog input terminal AN00, AN10 connected to the amplifier circuit AMP0 and the sample-and-hold circuit SH. As shown in FIG. 6, an analog input switch SW0, an amplifier circuit AMP0, and a control switch CSW0 are connected between the analog input terminal AN00 and the input terminal of the sample-and-hold circuit SH. The analog input terminals AN10 and the analog input switches SW4 are connected to the input terminal of the amplifier circuits AMP0.

Similar to FIG. 5, the metal wiring L00 provided between the analog input terminal AN00 and the analog input switch SW0 has a parasitic capacitance Cs1, and the metal wiring L0 provided between the analog input switch SW0 and the input terminal of the amplifier AMP0 has a parasitic capacitance Cs2. In addition, a parasitic capacitance Cs3 exists in the metallization line LP0 provided between the output terminal of the amplifier circuit AMP0 and the input terminal of the sample-and-hold circuit SH. A parasitic capacitance Cs10 exists in the metallic wire L10 provided between the analog input terminal AN10 and the analog input switch SW4. In this embodiment, the analog input switch SW4 is also connected to the metal line L0.

The control signal ASW0, ASW1 generated by the signal conversion circuit SWCNV transitions as follows. In FIG. 6, the control signal SCSW0_0 represents a signal supplied to the control switch CSW0 in the case of analog-to-digital conversion of an analog input signal supplied to the analog input terminal AN00, and the control signal SCSW0_1 represents a signal supplied to the control switch CSW0 in the case of analog-to-digital conversion of an analog input signal supplied to the analog input terminal AN10, as indicated by solid lines respectively. In the control signal SCSW0_1, the waveforms indicated by the dotted lines at the time t200 and the time t204 correspond to the waveforms indicated by the solid lines at the time t200 and the time t204 of the control signal SCSW0_0. In the control signal SCSW0_0, the waveform indicated by the dotted line in the time t202 corresponds to the waveform indicated by the solid line in the time t202 of the control signal SCSW0_1. Each waveform shown by a dotted line is a signal which does not affect the analog-to-digital conversion operation of each path, and therefore is shown by a dotted line.

First, before the time t200, it is assumed that the control signal ASW0 is at a high level, and the control signals SCSW0_0, SCSW0_1, and ASW4 are at a low level. That is, since the analog input switch SW0 is in the on state, the parasitic capacitance Cs1, Cs2, Cs3 is charged by the analog input signal supplied to the analog input terminal AN00.

At the time t200, the control signal SCSW0_0 transitions from the low level to the high level, the control switch CSW0 is turned on, the analog input signal supplied to the analog input terminal AN00 is sampled and held by the sample-and-hold circuit SH, and the analog-to-digital conversion operation is instructed. Thereafter, the control signal SCSW0_0 transitions from the high level to the low level, the control switch CSW0 is turned off.

At time t201, the analog-to-digital conversion operation of the analog input signal supplied to the analog input terminal AN00 is completed, the control signal ASW0 transitions from the high level to the low level, and the analog input switch SW0 is turned off. Based on the transition of the control signal ASW0 from the high level to the low level, the control signal ASW4 transitions from the low level to the high level. As a result, the analog input switches SW4 are turned on, and the parasitic capacitances Cs10, Cs2, Cs3 are charged by the analog input signals supplied to the analog input terminals AN10.

At the time t202, the control signal SCSW0_1 transitions from the low level to the high level, the control switch CSW0 is turned on, the analog input signal supplied to the analog input terminal AN10 is sampled and held by the sample-and-hold circuit SH, and the analog-to-digital conversion operation is instructed. Thereafter, the control signal SCSW0_1 transitions from the high level to the low level, the control switch CSW0 is turned off.

At time t203, the analog-to-digital conversion operation of the analog input signal supplied to the analog input terminal AN10 is completed, the control signal ASW4 transitions from the high level to the low level, and the analog input switch SW4 is turned off. Based on the transition of the control signal ASW4 from the high level to the low level, the control signal ASW0 transitions from the low level to the high level. As a result, the analog input switches SW0 are turned on, and the parasitic capacitances Cs1, Cs2, Cs3 are charged by the analog input signals supplied to the analog input terminals AN00.

In the time t204, an operation equivalent to the time t200 is performed, and in the time t205, an operation equivalent to the time t201 is performed.

As a result, the analog-to-digital conversion operation is performed by the scanning operation of the analog input signals supplied to the analog input terminals AN00, AN10 connected to the amplifier circuits AMP0.

FIG. 7 representatively shows operation waveforms of six control signals ASW0, ASW4, ASW8, ASW12, ASW16, ASW20 in the scanning operation of six analog input terminals AN00, AN10, AN20, AN30, AN40, AN50 connected to one amplifier AMP0 of FIG. 4.

At the time t300, the control signal ASW0 transitions from the high level to the low level, and the control signal ASW4 transitions from the low level to the high level based on the transition.

At the time t301, the control signal ASW4 transitions from the high level to the low level, and the control signal ASW8 transitions from the low level to the high level based on the transition.

At the time t302, the control signal ASW8 transitions from the high level to the low level, and the control signal ASW12 transitions from the low level to the high level based on the transition.

At the time t303, the control signal ASW12 transitions from the high level to the low level, and the control signal ASW16 transitions from the low level to the high level based on the transition.

At the time t304, the control signal ASW16 transitions from the high level to the low level, and the control signal ASW20 transitions from the low level to the high level based on the transition.

At the time t305, the control signal ASW20 transitions from the high level to the low level, and the control signal ASW0 transitions from the low level to the high level based on the transition.

By such an operation, the scanning operation of the six analog input terminals AN00, AN10, AN20, AN30, AN40, AN50 connected to the amplifier circuits AMP0 is performed. Similar operations are performed at the six analog inputs connected to each of the amplifier circuits AMP1~AMP3.

Next, a method of generating the high-level period T1 of the control signal ASW will be described with reference to FIG. 8. As described with reference to FIG. 4, the signal conversion circuit SWCNV receives the control signal SSW0~SSW23 and generates the control signal ASW0~ASW23. In FIG. 8, the control signal ASW3 is representatively described on how to generate the high-level period T1. FIG. 8 shows the control signal ASW0~ASW3 and the control signal SSW0~SSW3 in the scanning operation using the amplifier AMP0~AMP4. In the analog-to-digital conversion operation using the amplifier circuit AMP0, the control signal ASW0, SSW0 is used, and in the analog-to-digital conversion operation using the amplifier circuit AMP1, the control signal ASW1, SSW1 is used. In the analog-to-digital conversion operation using the amplifier circuit AMP2, the control signal ASW2, SSW2 is used, and in the analog-to-digital conversion operation using the amplifier circuit AMP3, the control signal ASW3, SSW3 is used.

At time t400, the control signal ASW0 is at a high level, the control signal ASW3 transitions from a low level to a high level, and the control signal SSW0 transitions from a low level to a high level. Thus, the analog-to-digital conversion operation using the amplifier circuits AMP0 is instructed.

At the time t401, the control signal ASW0 transitions from the high level to the low level, and the control signal SSW0 transitions from the high level to the low level. Thus, the analog-to-digital conversion operation using the amplifier AMP0 is completed. The control signal ASW1 is at a high level, and the control signal SSW1 transitions from a low level to a high level. Thus, the analog-to-digital conversion operation using the amplifier circuits AMP1 is instructed.

At the time t402, the control signal ASW1 transitions from the high level to the low level, and the control signal SSW1 transitions from the high level to the low level. Thus, the analog-to-digital conversion operation using the amplifier AMP1 is completed. The control signal ASW2 is at a high level, and the control signal SSW2 transitions from a low level to a high level. Thus, the analog-to-digital conversion operation using the amplifier circuits AMP2 is instructed.

At the time t403, the control signal ASW2 transitions from the high level to the low level, and the control signal SSW2 transitions from the high level to the low level. Thus, the analog-to-digital conversion operation using the amplifier AMP2 is completed. The control signal ASW3 is at a high level, and the control signal SSW3 transitions from a low level to a high level. Thus, the analog-to-digital conversion operation using the amplifier circuits AMP3 is instructed.

At the time t404, the control signal ASW3 transitions from the high level to the low level, and the control signal SSW3 transitions from the high level to the low level. Thus, the analog-to-digital conversion operation using the amplifier AMP3 is completed.

Here, the high-level period T1 of the control signal ASW3 is a period obtained by adding a high-level period T2a of the control signal SSW0, a high-level period T2b of the control signal SSW1, a high-level period T2c of the control signal SSW2, and a high-level period T2d of the control signal SSW3.

That is, the period of the high level of the control signal ASW3 is determined by the periods of the high level of the three control signals SSW0~SSW2 according to the preceding three amplifier circuits AMP0~AMP2 and the period of the high level of the control signal SSW3 according to the own amplifier circuit AMP3.

That is, in this embodiment, the signal conversion circuit SWCNV generates the control signal ASW3 based on the four control signals SSW0~SSW3.

As is clear from FIG. 8, the high-level period of the control signal ASW0 overlaps with the high-level period of the control signal ASW1~ASW3. The high-level period of the control signal ASW1 overlaps with the high-level period of the control signal ASW0, ASW2, ASW3. The high-level period of the control signal ASW2 overlaps with the high-level period of the control signal ASW0, ASW1, ASW3. The high-level period of the control signal ASW3 overlaps with the high-level period of the control signal ASW0, ASW1, ASW2. That is, in the scanning operation of four consecutive analog input terminals (AN00, AN01, AN02, AN03), the on state periods of the corresponding four analog input switches (SW0, SW1, SW2, SW3) overlap.

By combining FIG. 7 and FIG. 8, an analog signal input to the analog input terminal AN00~AN03, AN10~AN13, AN20~AN23, AN30~AN33, AN40~AN43, AN50~AN53 can be sequentially converted into a digital signal by a scanning operation. In this case, the numbers of the control signal ASW and the control signal SSW in FIG. 8 are changed to the reference numbers of the corresponding signals, as will be readily understood by those skilled in the art. That is, the control signal ASW0~ASW3 and the control signal SSW0~SSW3 in FIG. 8 are changed to the control signal ASW4~ASW7 and the control signal SSW4~SSW7. Further, the control signal ASW0~ASW3 and the control signal SSW0~SSW3 in FIG. 8 are changed to the control signal ASW8~ASW11 and the control signal SSW8~SSW11. Further, the control signal ASW0~ASW3 and the control signal SSW0~SSW3 in FIG. 8 are changed to the control signal ASW12~ASW15 and the control signal SSW12~SSW15. Further, the control signal ASW0~ASW3 and the control signal SSW0~SSW3 in FIG. 8 are changed to the control signal ASW16~ASW19 and the control signal SSW16~SSW19. Further, the control signal ASW0~ASW3 and the control signal SSW0~SSW3 in FIG. 8 are changed to the control signal ASW20~ASW23 and the control signal SSW20~SSW23.

FIG. 9 shows operation waveforms of the control signal ASW0~ASW7 and the control signal SCSW0~SCSW3 when the analog signal input to each of the eight analog input terminals AN00~AN03, AN10~AN13 is sequentially converted into a digital signal by the scanning operation. The operation waveforms of FIG. 9 differ from those of FIG. 2 in that the control signal SSW0~SSW7 of FIG. 2 is changed to the control signal ASW0~ASW7 converted by the signal conversion circuit SWCNV in FIG. 9. As a result of the change to the control signal ASW0~ASW7, as described with reference to FIG. 5, each high-level period of the control signal ASW0~ASW7 is set to T1 (4C), and the charge time of the parasitic capacitance Cs1,Cs2,Cs3 is changed from the period T4 (0.2C) to the period T3 (3.2C).

Further, as described with reference to FIG. 6, at time t1, the control signal ASW3 transitions from the low level to the high level based on the transition of the control signal ASW7 from the high level to the low level. At time t2, the control signal ASW4 transitions from the low level to the high level based on the transition of the control signal ASW0 from the high level to the low level. At time t3, the control signal ASW5 transitions from the low level to the high level based on the transition of the control signal ASW1 from the high level to the low level. At time t4, the control signal ASW6 transitions from the low level to the high level based on the transition of the control signal ASW2 from the high level to the low level.

Similarly, at time t5, the control signal ASW7 transitions from the low level to the high level based on the transition of the control signal ASW3 from the high level to the low level. At time t6, the control signal ASW0 transitions from the low level to the high level based on the transition of the control signal ASW4 from the high level to the low level. At time t7, the control signal ASW1 transitions from the low level to the high level based on the transition of the control signal ASW5 from the high level to the low level. At time t8, the control signal ASW2 transitions from the low level to the high level based on the transition of the control signal ASW6 from the high level to the low level. At time t9, the control signal ASW3 transitions from the low level to the high level based on the transition of the control signal ASW7 from the high level to the low level.

From time t10 to time t13, the same operation as that described from time t2 to time t5 is performed. The other operations in FIG. 9 are the same as those in FIG. 2, and a description thereof is omitted.

Since the respective amplifier circuits AMP0~AMP3 are configured to maintain the energized state at all times, when the control signal SCSW0~SCSW3 of the control switch CSW0~CSW3 is switched from the low level to the high level, the outputs of the corresponding amplifier circuits AMP0~AMP3 are in a sufficiently stable state, and the potentials of the subsequent analog input signals are transmitted to the sample-and-hold circuits SH. Therefore, as described with reference to FIG. 5, since the charge time of the parasitic capacitance Cs1,Cs2, Cs3 can be 16 times, the analog-to-digital converter can be performed at high speed while avoiding a large increase in cost, and effects such as simplification of external circuits of the analog input terminals and reduction in cost can be obtained.

Figure 10:
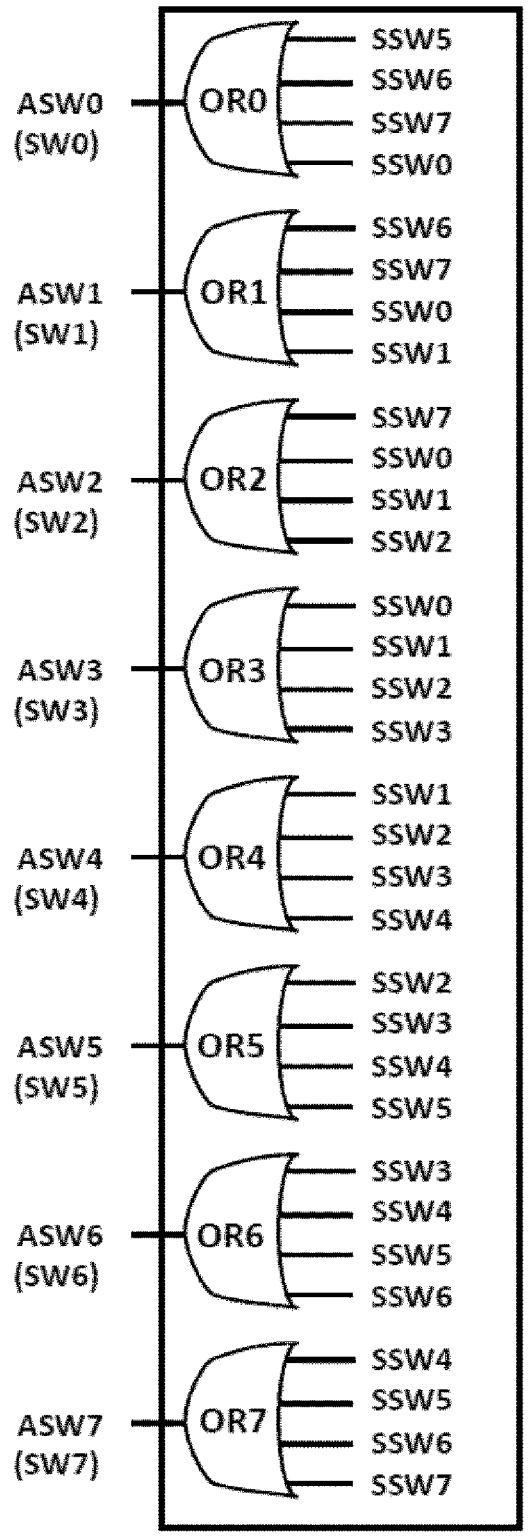
FIG. 10 is a diagram showing a first configuration example of the signal conversion circuit of FIG. 4.

(A first configuration example of the signal conversion circuit SWCNV) FIG. 10 is a diagram showing a first configuration example of the signal conversion circuit SWCNV of FIG. 4. The signal conversion circuit SWCNV1 shown in FIG. 10 is a configuration example of the signal conversion circuit SWCNV in case the analog input switches SW0~SW7 connected to the eight analog input terminals AN00~AN03, AN10~AN13 are scanned using the control signal ASW0~ASW7. Signal conversion circuit SWCNV1 includes eight OR-circuits OR0~OR7.

The OR-circuit OR0 receives four control signals SSW5, SSW6, SSW7, SSW0 at its four inputs and generates a control signal ASW0. The OR-circuit OR1 receives four control signals SSW6, SSW7, SSW0, SSW1 at its four inputs and generates a control signal ASW1. The OR-circuit OR2 receives four control signals, i.e., SSW7, SSW0, SSW1, SSW2, at its four inputs and generates a control signal ASW2. The OR-circuit OR3 receives four control signals SSW0, SSW1, SSW2, SSW3 at its four inputs and generates a control signal ASW3.

The OR-circuit OR4 receives four control signals SSW1, SSW2, SSW3, SSW4 at its four inputs and generates a control signal ASW4. The OR-circuit OR5 receives four control signals SSW2, SSW3, SSW4, SSW5 at its four inputs and generates a control signal ASW5. The OR-circuit OR6 receives four control signals SSW3, SSW4, SSW5, SSW6 at its four inputs and generates a control signal ASW6. The OR-circuit OR7 receives four control signals SSW4, SSW5, SSW6, SSW7 at its four inputs and generates a control signal ASW7.

As a result, the signal conversion circuit SWCNV1 can generate the control signal ASW0~ASW7 having the high-level period T1.

According to the signal conversion circuit SWCNV1, a part of the analog input switch SW0~SW7 in the multiplexer MPX can be driven by the control signal ASW0~ASW7. The other analog input switches SW8~SW23 in the multiplexers MPX can be driven by the control signals SSW8~SSW23. In the analog input terminal AN00~AN03, AN10~AN13 connected to the analog input switch SW0~SW7, it is effectively used when the conversion error of the analog input signal is large. Here, it is assumed that the analog input signal conversion error of the analog input signal is relatively small at the analog input terminal AN20~AN23, AN30~AN33, AN40~AN43, AN50~AN53 connected to the other analog input switches SW8~SW23 in the multiplexer MPX.

Therefore, since the analog input switch corresponding to the analog input signal which is considered to have a large conversion error of the analog input signal can be selectively or locally driven by the control signal ASW, the overall conversion error of the analog-to-digital conversion circuit ADC can be reduced. In addition, the convenience and applicability of semiconductor device including the analog-to-digital converter ADC can be enhanced.

Figure 11:
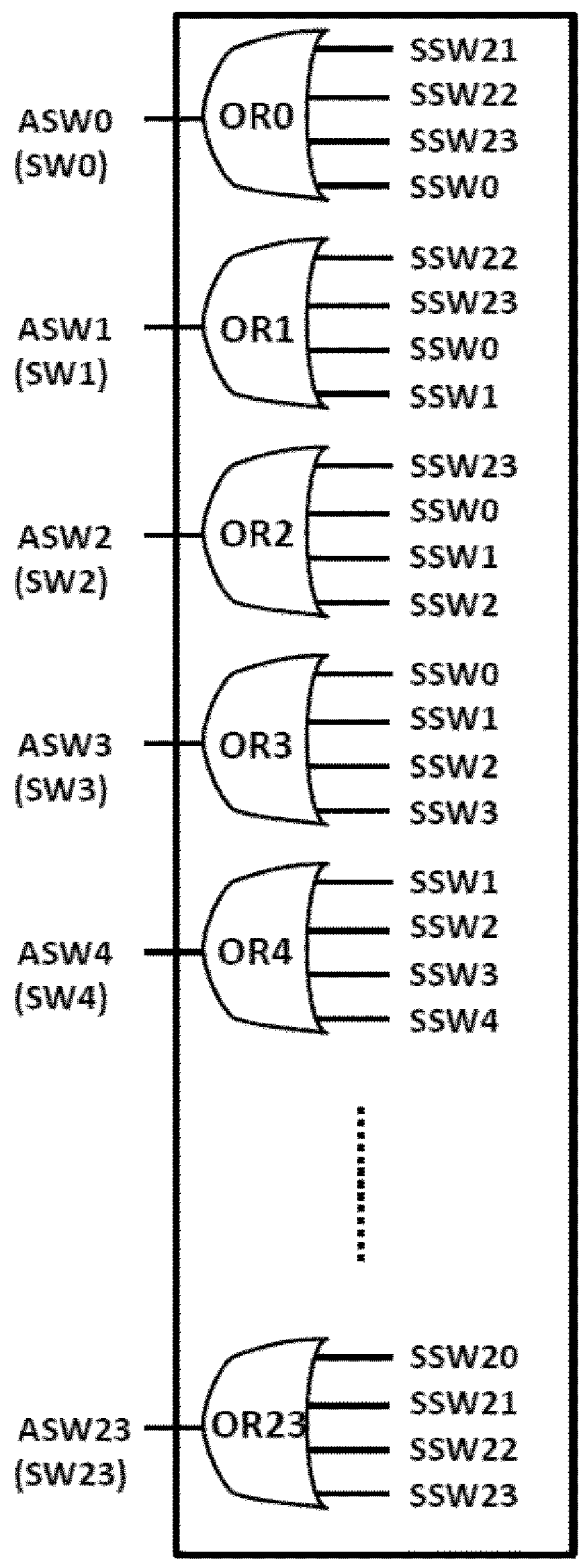
FIG. 11 is a diagram showing a second configuration example of the signal conversion circuit of FIG. 4.

(A second configuration example of the signal conversion circuit SWCNV) FIG. 11 is a diagram showing a second configuration example of the signal conversion circuit SWCNV. The signal conversion circuit SWCNV2 shown in FIG. 11 is a configuration example of the signal conversion circuit SWCNV when the 24 analog input terminals AN00~AN03, AN10~AN13, AN20~AN23, AN30~AN33, AN40~AN43, AN50~AN53 are scanned. The signal conversion circuit SWCNV2 includes 24 OR-circuits OR0~OR23.

The OR-circuit OR0 receives fo0$ur$ control signals SSW21, SSW22, SSW23, SSW0 at its four inputs and generates a control signal ASW0. The OR-circuit OR1 receives four control signals SSW22, SSW23, SSW0, SSW1 at its four inputs and generates a control signal ASW1. The OR-circuit OR2 receives four control signals SSW23, SSW0, SSW1, SSW2 at its four inputs and generates a control signal ASW2. The OR-circuit OR3 receives four control signals SSW0, SSW1, SSW2, SSW3 at its four inputs and generates a control signal ASW3.

Similarly, OR-circuits OR4~OR23 are provided to form a control signal ASW4~ASW23. In the OR-circuit OR4~OR23, the ORn for generating the control signal ASWn is configured to receive four control signals SSWn, SSWn-1, SSWn-2, SSWn-3 at its four inputs, where n is a positive integer from 4 to 23.

As a result, the signal conversion circuit SWCNV2 can generate the control signal ASW0~ASW23 having the high-level period T1.

Therefore, since all of the analog input switches corresponding to the analog input signal which is considered to have a large conversion error of the analog input signal can be driven by the control signal ASW, the overall conversion error of the analog-to-digital conversion circuit ADC can be reduced.

(First modified example) A first modified example is provided with a signal switching circuit SSCKT capable of supplying one of a plurality of control signals ASW (ASW0~ASW23) and a plurality of control signals SSW (SSW0~SSW23) to a plurality of analog input switches SW (SW0~SW23) in the multiplexer MPX. The switching circuit SSCKT is controlled by the value of the control register REG.

Figure 12:
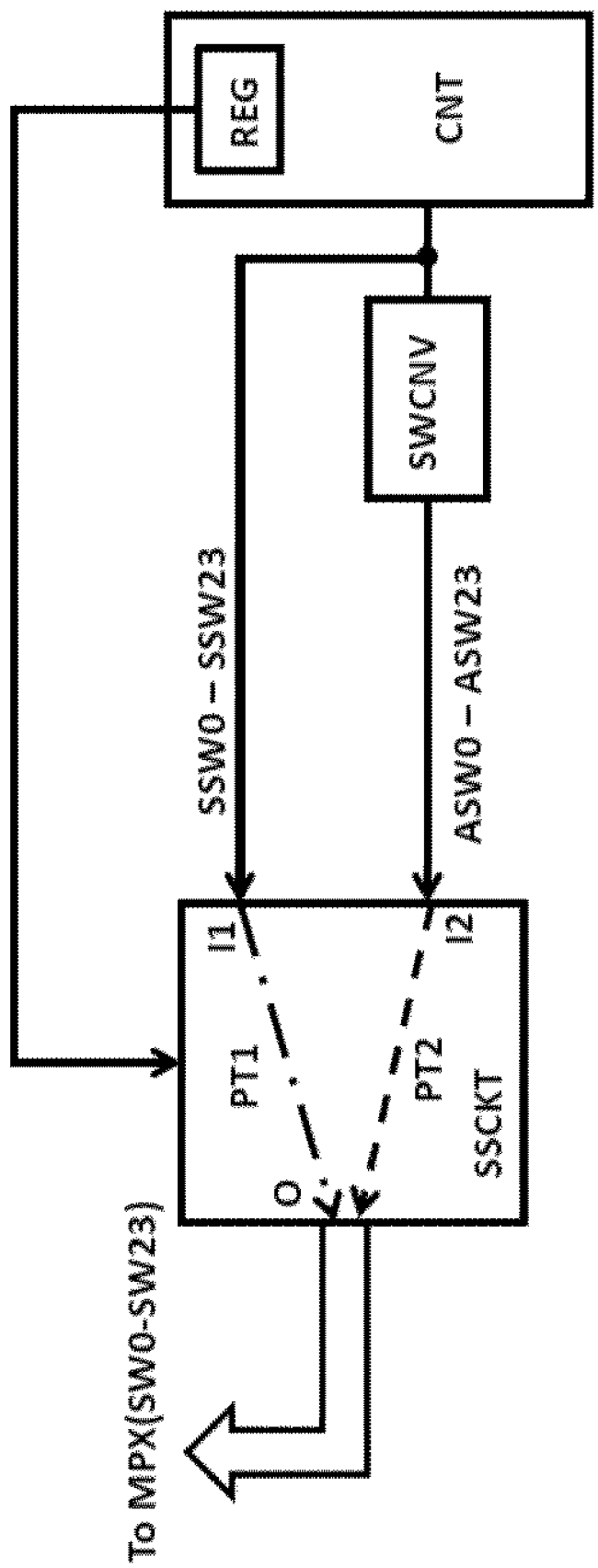
FIG. 12 is a diagram showing a main portion of an analog-to-digital converter according to a first modified example.

FIG. 12 is a diagram showing main portion of an analog-to-digital converter ADC according to the first modified example. As shown in FIG. 12, the analog-to-digital conversion circuit ADC includes a control circuit CNT, a signal conversion circuit SWCNV, and a signal switching circuit SSCKT. That is, the configuration between the control circuit CNT and the multiplexer MPX in FIG. 4 is changed to the configuration shown in FIG. 12.

As shown in FIG. 12, the control register REG is provided inside the control circuit CNT in one example. The control register REG can store first data and second data differing from the first data, and, for example, the control register REG can write the first data or the second data from the central processing unit, i.e., CPU. In one example, the first data is a value such as "0 (zero)" and the second data is a value such as "1".

The signal switching circuit SSCKT includes a first input unit I1 that receives the control signal SSW0~SSW23 output from the control circuit CNT, a second input unit I2 that receives the control signal ASW0~ASW23 generated from the signal conversion circuit SWCNV, and an output unit O.

The outputs are connected to a plurality of analog input switches SW0~SW23 in the multiplexer MPX.

When the first data "0" is written in the control register REG, the signal switching circuit SSCKT forms a first pass PT1 connecting the first input I1 to the output O. As a result, the control signals SSW0~SSW23 are supplied to the analog input switches SW0~SW23.

On the other hand, when the second data "1" is written in the control register REG, the signal switching circuit SSCKT forms a second pass PT2 connecting the second input I2 to the output O. As a result, the control signals ASW0~ASW23 are supplied to the analog input switches SW0~SW23.

Therefore, the analog input switch SW0~SW23 can be driven by selecting between the control signal ASW0~ASW23 and the control signal SSW0~SSW23. For example, if semiconductor device users have already developed software programs capable of correcting errors due to a shortage of sampling times of the analog-to-digital conversion circuit ADC, the analog input switch SW0~SW23 does not need to be driven by the control signal ASW0~ASW23. Thus, the way in which the analog input-switch SW0 SW23 is driven by the control signals SSW0~SSW23 can be changed on the basis of the values of the control registers.

Although an example in which the control register REG is provided inside the control circuit CNT has been described, the present invention is not limited thereto. The control register REG may be provided in a place other than the control circuit CNT. For example, the control register REG may be provided as a control register of the central processing unit of the semiconductor device.

When the signal switching circuit SSCKT is provided, the analog-to-digital conversion circuit may be changed to the analog-to-digital conversion circuit using the control signal SSW0~SSW23 after or during the execution of the analog-to-digital conversion circuit using the control signal ASW0~ASW23. Conversely, after or during the analog-to-digital conversion operation using the control signal SSW0~SSW23, the operation may be changed to the analog-to-digital conversion operation using the control signal ASW0~ASW23. In such cases, it is preferable to add a function of turning off all the analog input switches SW(SW0~SW23) to the signal switching circuit SSCKT. By turning off all of the analog input switches SW0~SW23, the analog input signals can be temporarily sampled off, thereby unwanted analog-to-digital conversion operations such as erroneous conversion can be avoided.

According to the first modified example, the convenience of semiconductor device including the analog-to-digital conversion circuit ADC can be improved by providing the signal switching circuit SSCKT.

(Second modified example) In second modified example, an input off timing signal generation circuit OFFTMG for generating an input off timing signal (OFTS) is provided in an analog-to-digital conversion circuit ADC, and a signal switching circuit SSCKT1 is controlled by an input off timing signal (OFTS). The signal switching circuit SSCKT1 changes the control signal ASW0~ASW23 supplied to the analog input switch SW (SW0~SW23) to the control signal SSW0~SSW23 based on the input off timing signal (OFTS). The signal switching circuit SSCKT1 also has a function of turning off all the analog input switches SW (SW0~SW23), i.e., AOCNT, as described in the first modified example.

Figure 13:
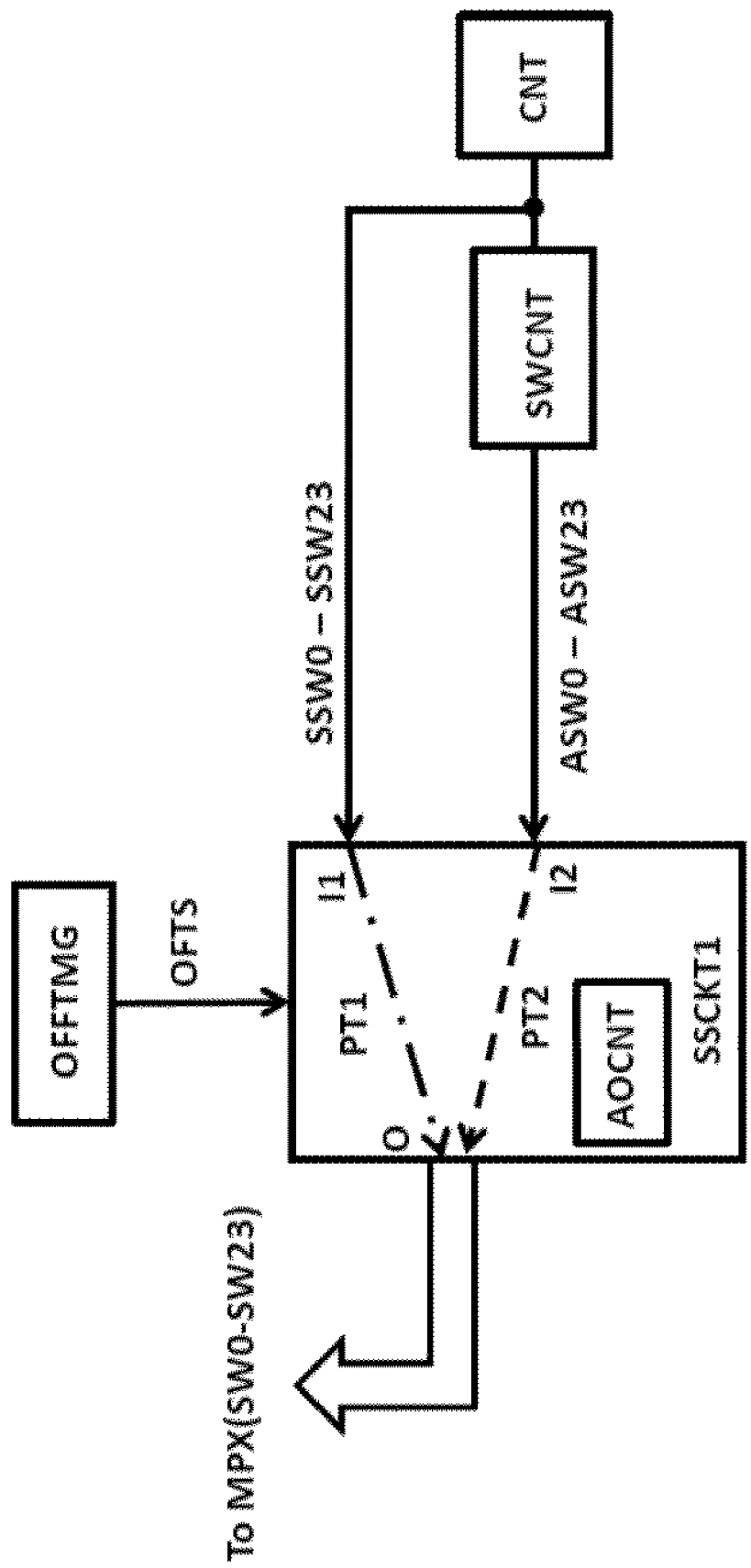
FIG. 13 is a diagram showing a main portion of an analog-to-digital converter according to a second modified example.

FIG. 13 is a diagram showing main portion of an analog-to-digital converter ADC according to the second modified example. As shown in FIG. 13, the analog-to-digital conversion circuit ADC includes a control circuit CNT, a signal conversion circuit SWCNV, a signal switching circuit SSCKT1, and an input-off timing signal generation circuit OFFTMG. That is, the configuration between the control circuit CNT and the multiplexer MPX in FIG. 4 is changed to the configuration shown in FIG. 13.

Similar to the signal switching circuit SSCKT of the first modified example, the signal switching circuit SSCKT1 includes a first input unit I1 for receiving the control signal SSW0~SSW23 output from the control circuit CNT, a second input unit I2 for receiving the control signal ASW0~ASW23 generated from the signal conversion circuit SWCNV, and an output portion O. The outputs are connected to a plurality of analog input switches SW0~SW23 in the multiplexer MPX. The signal switching circuit SSCKT1 further includes an all-off control circuit AOCNT as a function of turning off all the analog input switches SW0~SW23.

The input off timing signal generation circuit OFFTMG outputs an input off timing signal OFTS of, for example, a high level at the timing at which noise can be predicted to generate in advance. The input off timing signal OFTS can be regarded as a timing pulse signal which is temporarily at a high level.

When an input off timing signal OFTS such as a high level is output from the input off timing signal generation circuit OFFTMG, the signal switching circuit SSCKT1 temporarily changes the second path PT2 connecting the second input unit I2 to the output unit O to the first path PT1 connecting the first input unit I1 to the output unit O. As a result, the signal switching circuit SSCKT1 temporarily switches the control signal ASW0~ASW23 supplied to the analog input switch SW0~SW23 to the control signal SSW0~SSW23. In this instance, the control signal SSW0~SSW23 is switched to the control signal ASW0~ASW23 after a predetermined period has elapsed after the control signal ASW0~ASW23 is switched to the control signal SSW0~SSW23. That is, the control signal SSW0~SSW23 is supplied to the analog input switch SW0~SW23 in the timing or period in which noise is generated, and the control signal ASW0~ASW23 is supplied to the analog input switch SW0~SW23 in the timing or period in which noise is not generated.

Thus, by the timing or period of generating noise, since the charging period T3 of the parasitic capacitance by the analog input signal which has been extended by the control signal ASW0~ASW23 (see FIG. 5) is reduced, the probability of sampling and digital conversion of the potential of the analog input signal superimposed by noise can be reduced. On the other hand, in the timing or period in which no noises are generated, the parasitic capacitance can be charged by the analog input signal during the charging period T3 in which the period is extended by the control signal ASW0~ASW23, so that the overall conversion error of the analog-to-digital conversion circuit ADC can be reduced. Therefore, the analog-to-digital conversion accuracy of the analog-to-digital conversion circuit ADC can be further improved.

When the control signal ASW0~ASW23 is switched to the control signal SSW0~SSW23, an undesirable erroneous conversion may occur at the time of switching. In order to prevent such an undesirable erroneous conversion from occurring, when the control signal ASW0~ASW23 is switched to the control signal SSW0~SSW23, all of the analog input switches SW0~SW23 are temporarily turned off by the all-off control circuit AOCNT, and thereafter, the control signal SSW0~SSW23 is supplied to the analog input switch SW0~SW23. Moreover, when the control signal SSW0~SSW23 is switched to the control signal ASW0~ASW23, all of the analog input switches SW0~SW23 are temporarily turned off by the all-off control circuit AOCNT, and thereafter, the control signal ASW0~ASW23 is supplied to the analog input switch SW0~SW23. That is, the all-off control circuit AOCNT of the signal switching circuit SSCKT1 sets the control signal SSW0~SSW23 or the control signal ASW0~ASW23 to the low level so as to temporarily turn off all the analog input switches SW0~SW23.

Thus, when the control signal ASW0~ASW23 and the control signal SSW0~SSW23 are switched, an undesired erroneous conversion can be prevented.

The input off timing signal generation circuit OFFTMG can also be used to temporarily turn off the sampling of the analog input signal when the timing of the generation of noises can be predicted in advance in the control programs of semiconductor device including the central processing unit, i.e., CPU.

For example, if semiconductor device includes a CAN (Controller Aria Network) communication circuit, the predetermined operation of the CAN communication circuit may be a source of noises. In such cases, the input off timing signal generation circuit OFFTMG generates the input off timing signal OFTS based on the timing at which noises are predicted to occur in the control programs in a software manner, and outputs the input off timing signal OFTS to the signal switching circuit SSCKT1. The signal switching circuit SSCKT1 receiving the input off timing signal OFTS operates as described above.

As a result, the analog-to-digital conversion accuracy of the analog-to-digital conversion circuit ADC can be further improved.

(Third modified example) The second modified example predicts the occurrence of noise by software, temporarily changes the time signal ASW0~ASW23 to the control signal SSW0~SSW23 based on the predicted occurrence of noise, and supplies the control signal to the analog input switch SW0~SW23. In a third modified example, a noise detection circuit NDET for detecting generation of noise in terms of hardware is provided in the analog-to-digital conversion circuit ADC. Even when it is impossible to predict the occurrence of external noise or the like, the conversion error of the analog-to-digital conversion circuit ADC can be reduced.

Figure 14:
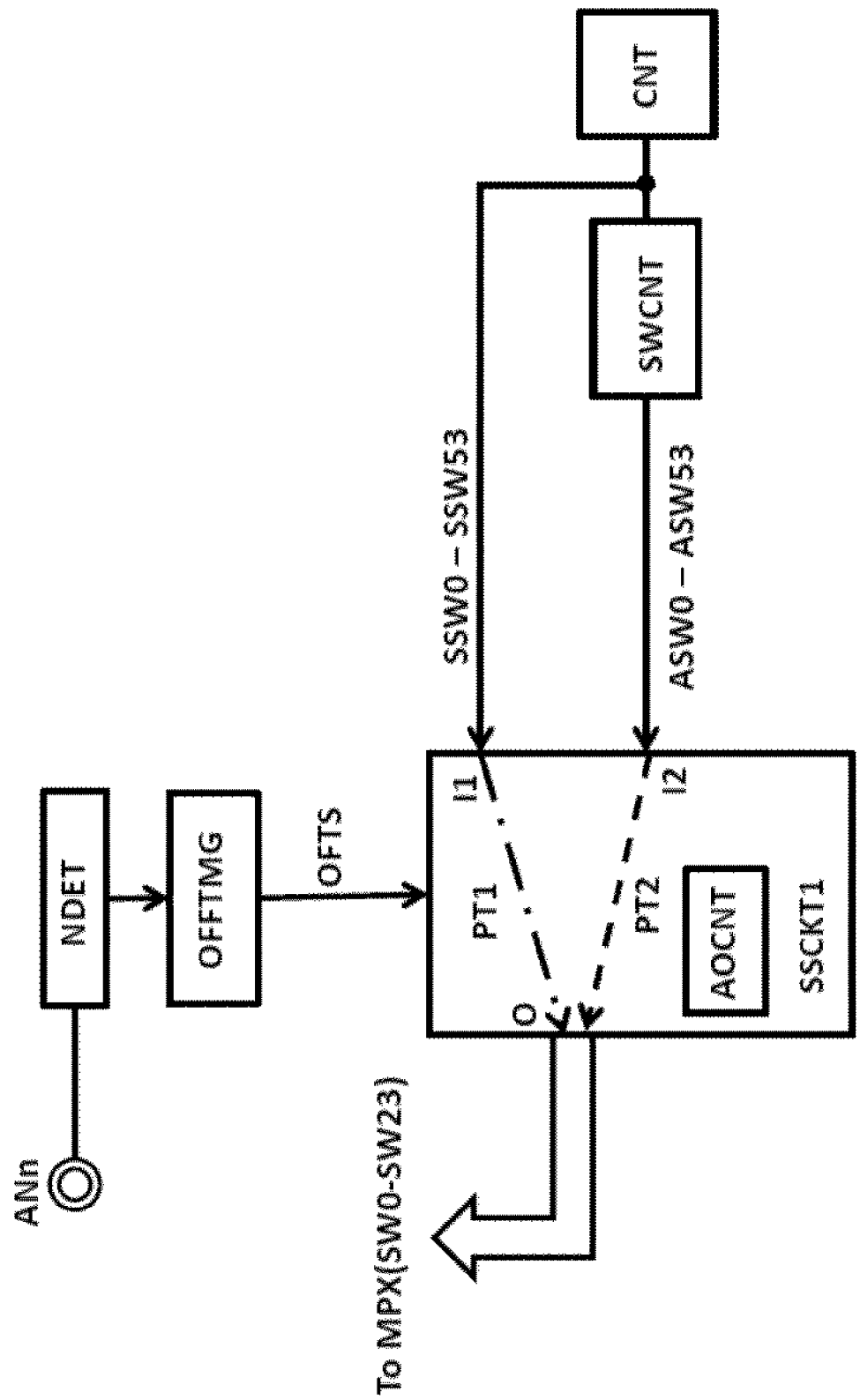
FIG. 14 is a diagram showing a main portion of an analog-to-digital converter according to a third modified example.

FIG. 14 is a diagram showing main portion of an analog-to-digital converter ADC according to the third modified example. As shown in FIG. 14, the analog-to-digital conversion circuit ADC includes a control circuit CNT, a signal conversion circuit SWCNV, a signal switching circuit SSCKT1, an input off timing signal generation circuit OFFTMG, and a noise detection circuit NDET. That is, the configuration between the control circuit CNT and the multiplexer MPX in FIG. 4 is changed to the configuration shown in FIG. 14. FIG. 14 differs from FIG. 13 in that the noise detection circuit NDET connected to the analog input terminal ANn is provided in FIG. 14. Other configurations and operations in FIG. 14 are the same as those in FIG. 13, and therefore description thereof is omitted.

The analog input terminal ANn is each of the analog input terminals AN00~AN03, AN10~AN13, AN20~AN23, AN30~AN33, AN40~AN43, AN50~AN53 shown in FIG. 4. That is, the noise detection circuit NDET is connected to all the terminals of the analog input terminal AN00~AN03, AN10~AN13, AN20~AN23, AN30~AN33, AN40~AN43, AN50~AN53. Alternatively, if it is desired to reduce the area of semiconductor substrate on which semiconductor device is formed, the noise detection circuit NDET can be connected to some analog input terminals selected from the analog input terminals AN00~AN03, AN10~AN13, AN20~AN23, AN30~AN33, AN40~AN43, AN50~AN53. Some of the selected analog input terminals are, for example, analog input terminals where noise is predicted to be a problem.

When noise is superimposed on the analog input signal input to the analog input terminal ANn, the noise detection circuit NDET detects the superimposed noise and outputs the noise detection result to the input off timing signal generation circuit OFFTMG.

The input off timing signal generation circuit OFFTMG generates an input off timing signal OFTS by using the input noise detection result (noise detection signal) as a trigger, and outputs the input off timing signal to the signal switching circuit SSCKT1. The signal switching circuit SSCKT1 temporarily switches the control signal ASW0~ASW23 supplied to the analog input switch SW0~SW23 to the control signal SSW0~SSW23 based on the input off timing signal OFTS, as described in the second modified example. In this instance, the control signal SSW0~SSW23 is switched to the control signal ASW0~ASW23 after a predetermined period has elapsed after the control signal ASW0~ASW23 is switched to the control signal SSW0~SSW23. The elapse of the predetermined time can be measured by, for example, a timer circuit (TM) provided in the semiconductor device.

Figure 15:
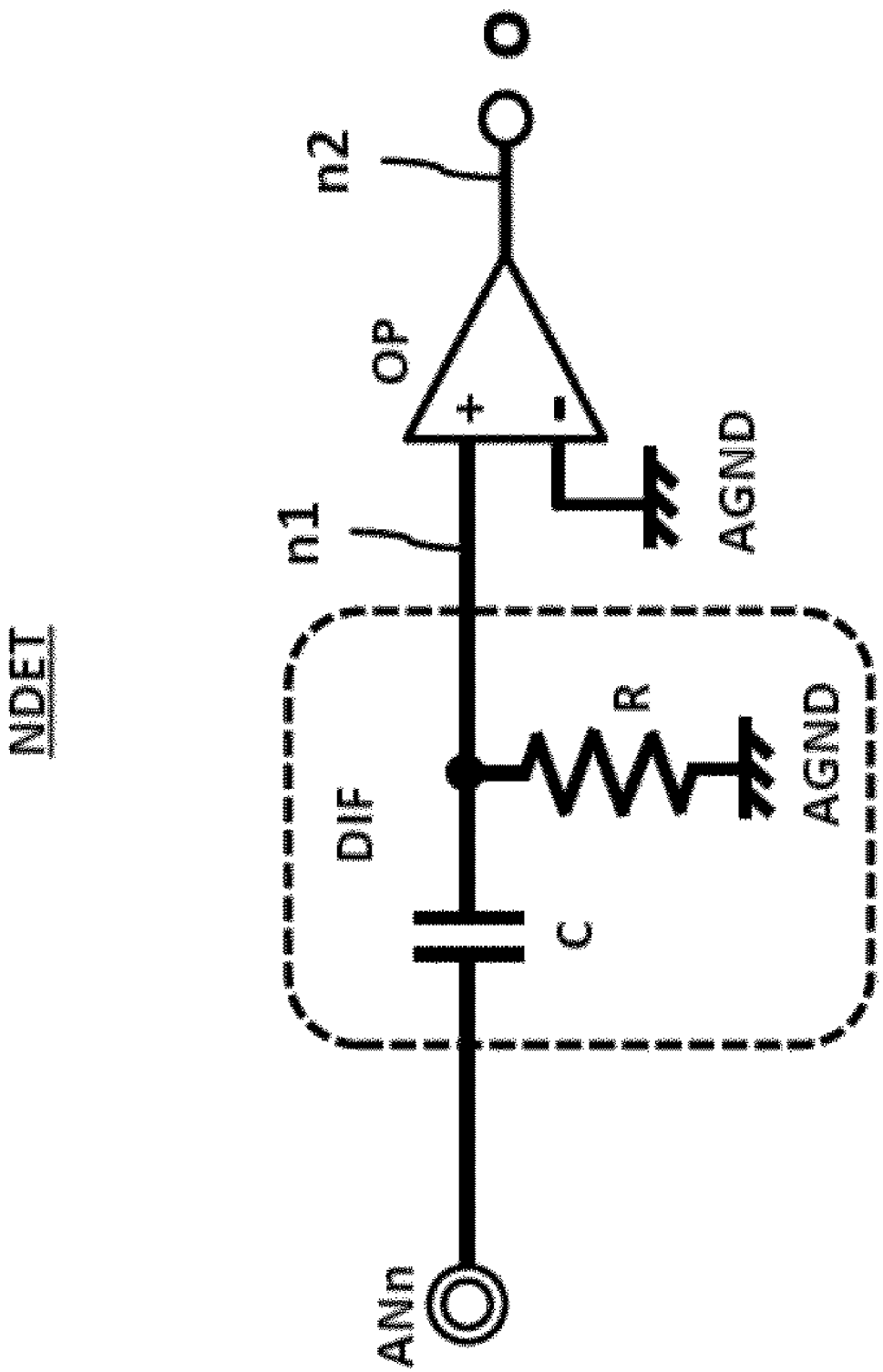
FIG. 15 is a diagram showing a configuration example of the noise detection circuit of FIG. 14.
Figure 16:
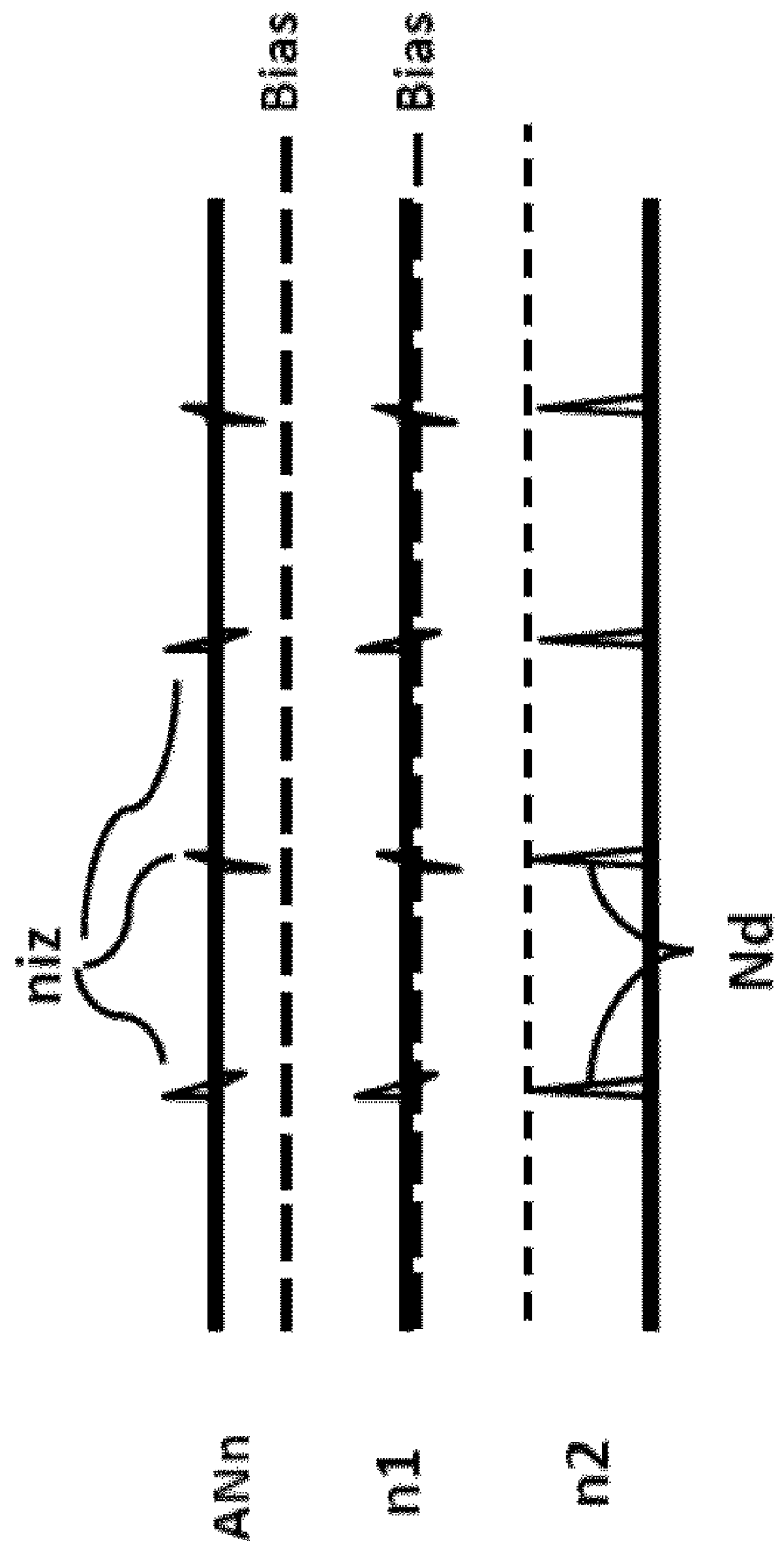
FIG. 16 is a diagram illustrating operation waveforms of the noise detection circuit of FIG. 15.

(A configuration example of the noise detection circuit NDET) FIG. 15 is a diagram illustrating a configuration example of the noise detection circuit NDET of FIG. 14. FIG. 16 is a diagram illustrating operation waveforms of the noise detection circuit NDET of FIG. 15.

As shown in FIG. 15, the noise detection circuit NDET includes a differentiating circuit DIF connected to the analog input terminal ANn and an amplifier circuit OP connected to the differentiating circuit DIF. The differentiating circuit DIF includes a capacitive element C and a resistive element R. The capacitive element C has a first terminal connected to the analog input terminal ANn and a second terminal connected to the non-inverting input (+) of the amplifier circuit OP. The resistive element R is connected between the second terminal of the capacitive element C and the ground potential AGND. The inverting inputs (−) of the amplifier circuits OP are connected to the ground potential AGND. An output terminal O of the amplifier circuit OP is connected to an input terminal of the input off timing signal generation circuit OFFTMG.

Referring to FIG. 16, a node n1 represents a node of an output terminal of the differentiating circuit DIF of FIG. 15, and a node n2 represents a node of an output terminal of the amplifier circuit OP of FIG. 15. Assume that an analog input signal including noise niz is supplied to the analog input terminal AN. In this case, the differentiating circuit DIF differentiates the analog input signal including the noise niz, and changes the bias, i.e., Bias, of the analog input signal as indicated by the waveform of the node n1. The amplifier circuit OP amplifies the amplitude of the differential waveform corresponding to the noise niz component of the node n1 to generate the noise detection signal Nd, as shown by the waveform of the node n2.

The input terminal of the input off timing signal generation circuit OFFTMG is supplied with the waveforms of the nodes n2, and the input off timing signal generation circuit OFFTMG generates the input off timing signal OFTS by using the noise detection signal Nd as a trigger.

Figure 17:
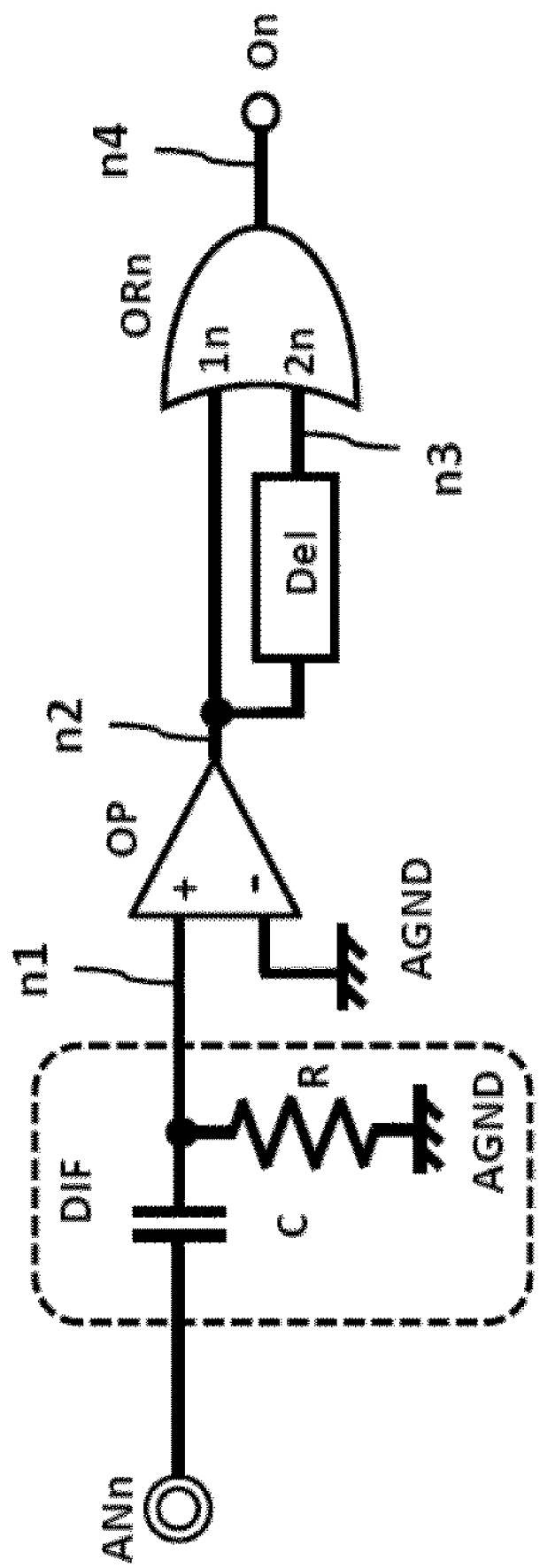
FIG. 17 is a block diagram showing a configuration example of a noise detection circuit according to a modified example.
Figure 18:
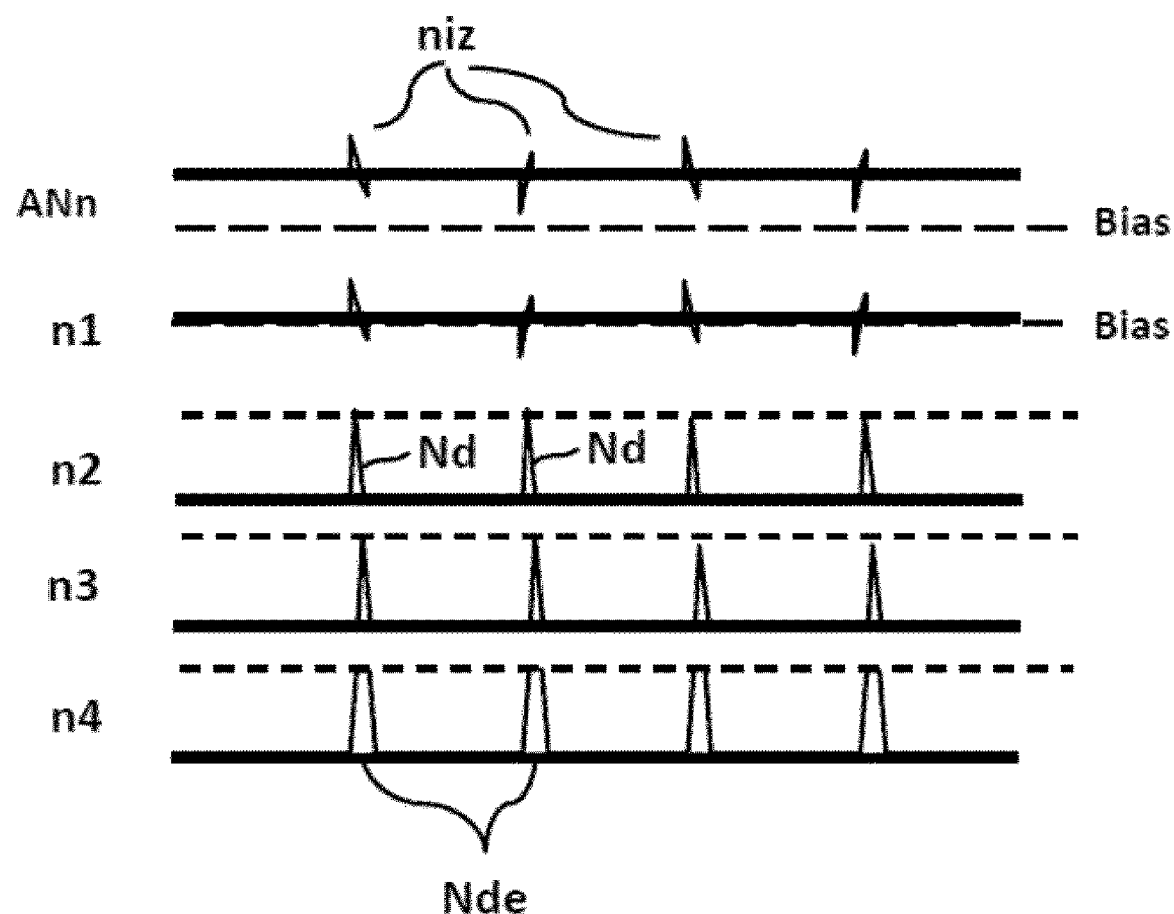
FIG. 18 is a diagram illustrating operation waveforms of the noise detection circuit of FIG. 17.

(A modified example of the noise detection circuit NDET) FIG. 17 is a diagram showing a configuration example of a noise detection circuit NDET1 according to the modified example. FIG. 18 is a diagram illustrating operation waveforms of the noise-detection circuit NDET1 of FIG. 17.

The noise detection circuit NDET1 of FIG. 17 differs from the noise detection circuit NDET of FIG. 15 in that a delay device Del and an OR-circuit ORn connected to the output terminal of the amplifier circuit OP are provided in FIG. 17. The OR-circuit ORn includes a first input terminal 1n connected to the output terminal of the amplifier circuit OP, a second input terminal 2n connected to the output terminal of the amplifier circuit OP via the delay device Del, and an output terminal On. Therefore, the OR-circuit ORn outputs the noise detection signal Nde obtained by widening the differential waveform of the node n2. Since the other configuration and operation of the noise detection circuit NDET1 of FIG. 17 are the same as those of the noise detection circuit NDET of FIG. 15, descriptions thereof are omitted.

The operation waveform shown in FIG. 18 differs from the operating waveform shown in FIG. 16 in that the operating waveform of the node n3 of the output of the delay element Del and the operating waveform of the node n4 of the output terminal On of the OR-circuit ORn are added. The waveforms of the analog input terminal ANn, the node n1, and the node n2 shown in FIG. 18 are the same as the waveforms of the analog input terminal ANn, the node n1, and the node n2 shown in FIG. 16, and therefore description thereof is omitted.

As shown in FIG. 18, the waveform of the node n3 is a waveform obtained by delaying the noise detection signal Nd of the node n2 by the delay element Del. Since the waveform of the node n3 and the waveform of the node n2 are input to the OR-circuit ORn, the widened noise detection signal Nde is output to the node n4.

The input terminal of the input off timing signal generation circuit OFFTMG is supplied with the waveforms of the nodes n4, and the input off timing signal generation circuit OFFTMG generates the input off timing signal OFTS by using the noise detection signal Nde as a trigger. Since the width of the noise detection signal Nde is widened as compared with the width of the noise detection signal Nd, the time during which the analog input signal is not sampled is extended as compared with the case where the noise detection signal Nd is used as a trigger. Therefore, it is possible to further reduce the effect of the external noise superimposed on the analog input terminal.

Figure 19:
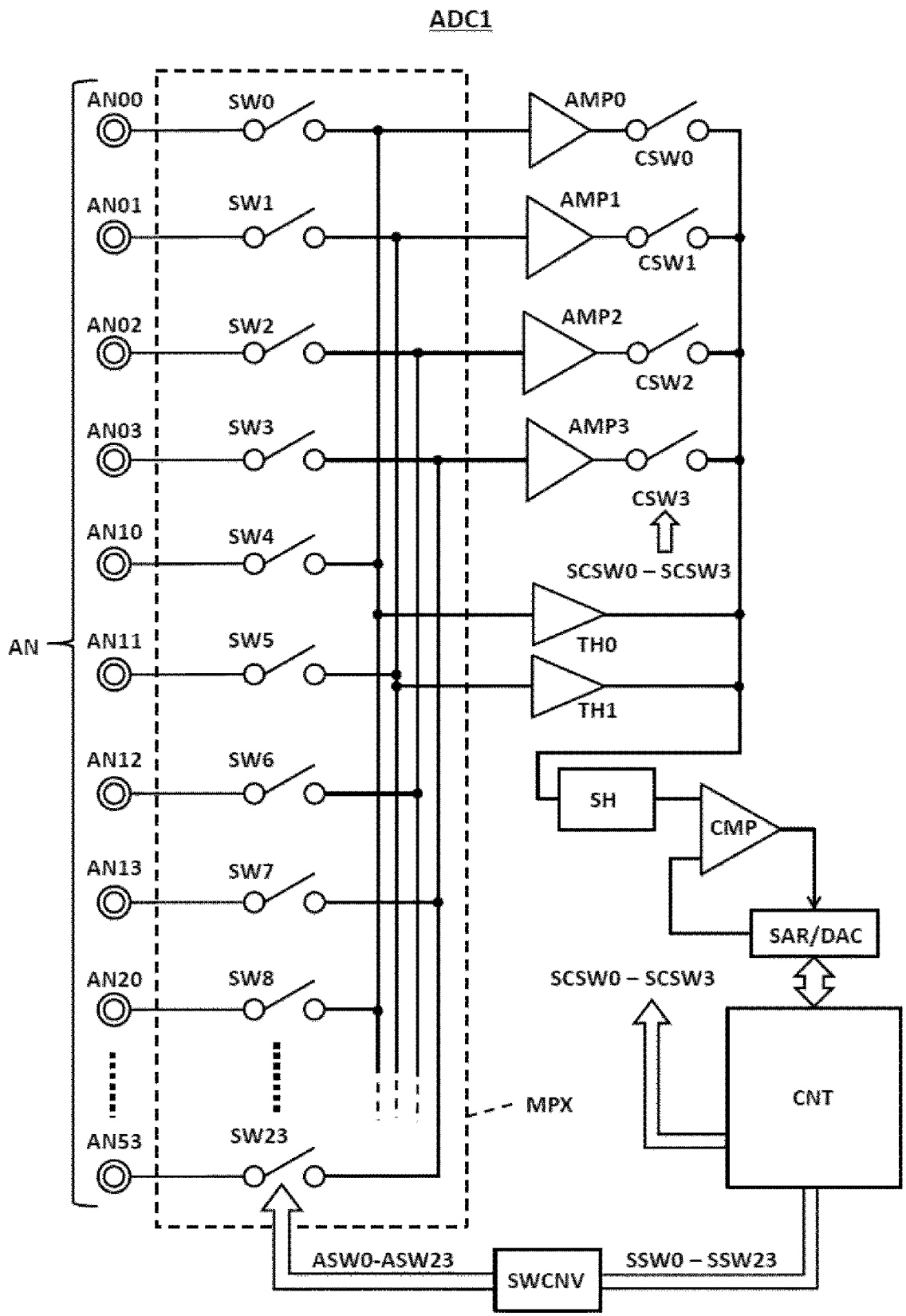
FIG. 19 is a diagram illustrating a configuration example of an analog-to-digital converter according to a fourth modified example.

(A fourth modified example) FIG. 19 is a diagram illustrating a configuration example of an analog-to-digital converter ADC1 according to a fourth modified example. The analog-to-digital conversion circuit ADC1 of FIG. 19 differs from the analog-to-digital conversion circuit ADC of FIG. 4 in that a track-and-hold circuit TH0, TH1 is provided in FIG. 19. Other configurations and operations of the analog-to-digital conversion circuit ADC1 of FIG. 19 are the same as those of the analog-to-digital conversion circuit ADC of FIG. 4, and therefore descriptions thereof are omitted.

The track-and-hold circuit TH0 is provided between the six analog input switches SW0, SW4, SW8, SW12, SW16, SW20 and the sample-and-hold circuit SH. The analog input switch SW0, SW4, SW8, SW12, SW16, SW20 is controlled by the control signal ASW0, ASW4, ASW8, ASW12, ASW16, ASW20. When one of the analog input switches SW0, SW4, SW8, SW12, SW16,SW20 is turned on, the track-and-hold circuit TH0 outputs a signal potential that follows the signal potential of the analog input signal input via the analog input switch in the on state. When the sample-and-hold circuit SH samples the signal potential outputted from the track-and-hold circuit TH0, the track-and-hold circuit TH0 holds the signal potential of the analog input signal at that time. The signal potential sampled by the sample-and-hold circuit SH is converted into a digital signal by the comparator circuit CMP and the analog-to-digital converter SAR/DAC.

The track-and-hold circuit TH1 is provided between the six analog input switches SW1, SW5, SW9, SW13, SW17, SW21 and the sample-and-hold circuit SH. The six analog input switches SW1, SW5, SW9, SW13, SW17, SW21 are controlled by the control signals ASW1, ASW5, ASW9, ASW13, ASW17, ASW21. When one of the analog input switches SW1, SW5, SW9, SW13, SW17,SW21 is turned on, the track-and-hold circuit TH1 outputs a signal potential that follows the signal potential of the analog input signal input via the analog input switch in the on state. When the sample-and-hold circuit SH samples the signal potential outputted from the track-and-hold circuit TH1, the track-and-hold circuit TH1 holds the signal potential of the analog input signal at that time. The signal potential sampled by the sample-and-hold circuit SH is converted into a digital signal by the comparator circuit CMP and the analog-to-digital converter SAR/DAC.

Therefore, the same effects as those of the embodiments can be obtained. Further, since the connection time of the external analog input signal connected to the track-and-hold circuit TH0, TH1 can be lengthened, the sampling error of the track-and-hold circuit TH0, TH1 according to successive approximation type analog-to-digital conversion circuit ADC1 can be reduced.

Figure 20:
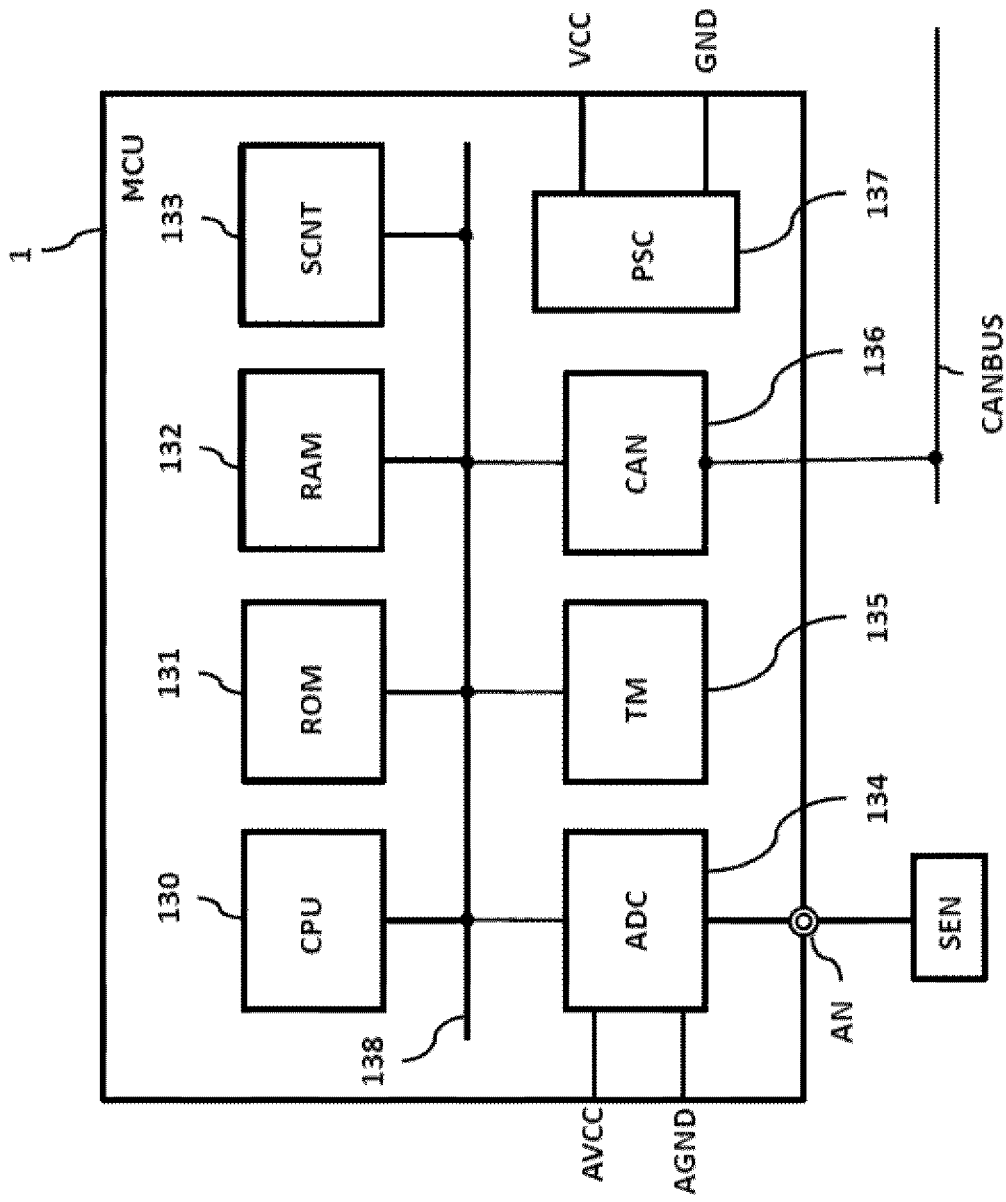
FIG. 20 is a diagram showing a configuration example of a semiconductor device according to an application example.

FIG. 20 is a diagram showing a configuration example of a semiconductor device 1 according to an application example. The semiconductor device 1 shown in FIG. 20 is an in-vehicle microprocessor MCU formed on one semiconductor chip. The microprocessor MCU includes a central processing unit (CPU) 130, a nonvolatile memory (ROM) 131 comprising a flash memory or the like, a volatile memory (RAM) 132 comprising a static random access memory (SRAM) or the like, and a system control circuit (SCNT) 133. The microprocessor MCU further includes an analog-to-digital conversion circuit (ADC) 134, a timer circuit (TM) 135, a CAN communication circuit (CAN) 136, a power supply circuit (PSC) 137, and the like serving as a peripheral circuit of the microprocessor MCU. The circuits 130, 131, 132, 133, 134, 135, and 136 are connected to each other via a bus 138. In this example, the power supply circuit 14 is supplied the power supply potential VCC and the ground potential GND, and generates an internal power supply potential for a digital circuit such as the circuits 130, 131, 132, 133, 135, and 136 and an internal ground potential for the digital circuit.

The nonvolatile memory 131 stores control programs and software executed by the central processing unit 130. The volatile memory 132 serves as a working area of the central processing unit 130, and is used to store temporary data.

As the analog-to-digital conversion circuit (ADC) 134, the analog-to-digital conversion circuits ADC, ADC1 of the embodiments and the first to fourth modified examples are applicable. The analog-to-digital conversion circuit, i.e., ADC, 134 is connected to an analog input terminal AN. A plurality of sensor circuits SEN are connected to the analog input terminal AN. The analog input terminal AN may be an analog input terminal AN00~AN03, AN10~AN13, AN20~AN23, AN30~AN33, AN40~AN43, AN50~AN53 as described in the embodiment. In this embodiment, the analog-to-digital conversion circuit, i.e., ADC, 134 is supplied the power supply potential AVCC for the analog circuit and the ground potential AGND for the analog circuit. Since the power supply potential AVCC for the analog circuit and the ground potential AGND for the analog circuit are separated from the power supply potential VCC and the ground potential GND, the analog-to-digital conversion circuit, i.e., ADC, 134 is driven by the power supply potential AVCC and the ground potential AGND with relatively little noise. As a result, the analog-to-digital conversion circuit 134 with a small conversion error is formed.

The CAN 136 is connected to CANBUS and performs communication based on CAN protocols with other in-vehicle microprocessors provided in vehicles such as automobiles.

While the invention made by the present inventor has been specifically described above based on the Embodiment, the present invention is not limited to the above-described embodiment and Embodiment, and it is needless to say that the present invention can be variously modified.

What is claimed is:

1. A semiconductor device comprising:
   an analog input terminal;
   an amplifier circuit comprising an input terminal and an output terminal;
   a sample-and-hold circuit comprising an input terminal and an output terminal;
   an analog input switch coupled between the analog input terminal and the input terminal of the amplifier circuit;
   a control switch coupled between the output terminal of the amplifier circuit and the input terminal of the sample-and-hold circuit;
   a comparison circuit coupled to the output terminal of the sample-and-hold circuit;
   an analog-to-digital converter coupled to the comparison circuit;
   a control circuit that outputs a first control signal; and
   a signal conversion circuit that converts the first control signal output from the control circuit into a second control signal,
   wherein the control circuit further supplies a third control signal to the control switch,
   wherein the third control signal is temporarily activated at the beginning of the period of the activation level of the first control signal, and turn on the control switch,
   wherein the analog input switch is turned on during the activation level of the second control signal,
   wherein a period of an activation level of the second control signal is longer compared to a period of an activation level of the first control signal.

2. The semiconductor device according to claim 1, further comprising a signal switching circuit,
   wherein the signal switching circuit receives the first control signal and the second control signal, and supplies one of the first control signal and the second control signal to the analog input switch.

3. The semiconductor device according to claim 2, further comprising a control register,
   wherein the signal switching circuit supplies one of the first control signal and the second control signal to the analog input switch based on data stored in the control register.

4. The semiconductor device according to claim 2, further comprising an input off timing signal generation circuit,
   wherein the signal switching circuit temporarily changes the second control signal supplied to the analog input switch to the first control signal based on an input off timing signal generated from the input off timing signal generation circuit.

5. The semiconductor device according to claim 4, further comprising a noise detection circuit coupled to the analog input terminal,
   wherein the input off timing signal generation circuit generates the input off timing signal based on a noise detection signal of the noise detection circuit.

6. The semiconductor device according to claim 5, the noise detection circuit comprising:
   a differentiating circuit coupled to the analog input terminal;
   an amplifier circuit coupled to the differentiating circuit; and
   a delayed element and an OR-circuit, coupled to an output terminal of the amplifier circuit,
   wherein the OR-circuit outputs a noise detection signal widening a differential wave shape of the output terminal of the amplifier circuit, and provides the noise detection signal to the input off timing signal generation circuit.

7. A semiconductor device comprising:
   a first path including a first analog input terminal, a first analog input switch, a first amplifier circuit, a first control switch;
   a second path including a second analog input terminal, a second analog input switch, a second amplifier circuit, a second control switch;
   a third path including a third analog input terminal, a third analog input switch, a third amplifier circuit, a third control switch;
   a fourth path including a fourth analog input terminal, a fourth analog input switch, a fourth amplifier circuit, a fourth control switch;
   a sample-and-hold circuit including an input terminal coupled to the first to fourth control switch and an output terminal;
   a comparison circuit coupled to the output terminal of the sample-and-hold circuit;
   an analog-to-digital converter coupled to the comparison circuit;
   a control circuit that generates a first to fourth control signal, and a fifth to eighth control signal for controlling on and off states of the first to fourth control switch; and
   a signal conversion circuit that generates a ninth to twelfth control signal for controlling on and off states of the first to fourth analog input switch based on the first to fourth control signal,
   wherein a period of an activation level of the ninth to twelfth control signal is longer compared to a period of an activation level of the first to fourth control signal,
   wherein the fifth to eighth control signal is temporarily activated at the beginning of the period of the activation level of the first to fourth control signal, and turn on the first to fourth control switch,
   wherein the first to fourth analog input switch is turned on during the activation level of the ninth to twelfth control signal,
   wherein an on state period of the first to fourth analog input switch overlaps.

8. The semiconductor device according to claim 7, wherein the period of the activation level of each of the ninth to twelfth control signal is a period obtained by adding a period of an analog-to-digital conversion operation using a corresponding amplifier circuit and periods of analog-to-digital conversion operations using other three amplifier circuits.

9. The semiconductor device according to claim 8, further comprising a signal switching circuit,
   wherein the signal switching circuit receives the first to fourth control signal and the ninth to twelfth control signal, and supplies one of the first to fourth control signal or the ninth to twelfth control signal, to the first to fourth analog input switch.

10. The semiconductor device according to claim 9, further comprising a control register,
    wherein the signal switching circuit supplies one of the first to fourth control signal or the ninth to twelfth control signal to the first to fourth analog input switch based on data stored in the control register.

11. The semiconductor device according to claim 9, further comprising an input off timing signal generation circuit,
    wherein the signal switching circuit temporarily changes the ninth to twelfth control signal supplied to the first to fourth analog input switch to the first to fourth control signal based on an input off timing signal generated from the input off timing signal generation circuit.

12. The semiconductor device according to claim 11, further comprising a noise detection circuit coupled to the analog input terminal selected from the first to fourth analog input terminal,
    wherein the input off timing signal generation circuit generates the input off timing signal based on a noise detection signal of the noise detection circuit.

13. The semiconductor device according to claim 12, the noise detection circuit comprising:
    a differentiating circuit coupled to the analog input terminal selected from the first to fourth analog input terminal;
    an amplifier circuit coupled to the differentiating circuit; and
    a delayed element and an OR-circuit, coupled to an output terminal of the amplifier circuit,
    wherein the OR-circuit outputs a noise detection signal widening a differential wave shape of the output terminal of the amplifier circuit, and provides the noise detection signal to the input off timing signal generation circuit.

14. The semiconductor device according to claim 7,
    the first path further including a fifth analog input terminal and a fifth analog input switch;
    the second path further including a sixth analog input terminal and a sixth analog input switch;
    the third path further including a seventh analog input terminal and a seventh analog input switch;
    the fourth path further including an eighth analog input terminal and an eighth analog input switch; and
    the control circuit further generating a thirteenth to sixteenth control signal,
    wherein the signal conversion circuit generates the ninth to twelfth control signal to control on and off states of the first to fourth analog input switch, and the seventeenth to twentieth control signal to control on and off states of the fifth to eighth analog input switch, based on the first to fourth control signal and the thirteenth to sixteenth control signal respectively,
    wherein the fifth to eighth analog input switch is turned on during an activation level of the seventeenth to twentieth control signal,
    wherein the period of the activation level of the ninth to twelfth control signal and the seventeenth to twentieth control signal is longer compared to the period of the activation level of the first to fourth control signal.

15. The semiconductor device according to claim 14, wherein the period of the activation level of each of the ninth to twelfth and seventeenth to twentieth control signal is a period obtained by adding a period of the analog-to-digital conversion operation using a corresponding amplifier circuit and periods of analog-to-digital conversion operations using other three amplifier circuits.

16. The semiconductor device according to claim 15,
    wherein the analog signal input to each of the first to eighth analog input terminal is sequentially converted into a digital signal by scanning operation from the first to eighth analog input terminal,
    wherein the first to eighth analog input switch is turned on by the activation level of the ninth to twelfth and seventeenth to twentieth control signal, respectively,
    wherein an on state period of four consecutive analog input switch overlaps in the scanning operation of corresponding analog input switches.

\* \* \* \* \*